(12) United States Patent  
Suzuki

(10) Patent No.: US 12,050,557 B2  
(45) Date of Patent: Jul. 30, 2024

(54) COMPUTERIZED SYSTEMS AND METHODS OF DATA COMPRESSION

(71) Applicant: Takashi Suzuki, Scottsdale, AZ (US)

(72) Inventor: Takashi Suzuki, Scottsdale, AZ (US)

(*) Notice: Subject to any disclaimer, the term of this patent is extended or adjusted under 35 U.S.C. 154(b) by 409 days.

(21) Appl. No.: 17/532,947

(22) Filed: Nov. 22, 2021

(65) Prior Publication Data

US 2022/0107919 A1 Apr. 7, 2022

Related U.S. Application Data

(63) Continuation-in-part of application No. 16/951,954, filed on Nov. 18, 2020, now Pat. No. 11,741,121, and (Continued)

(51) Int. Cl.
*G06F 16/174* (2019.01)
*G06F 16/00* (2019.01)
(Continued)

(52) U.S. Cl.
CPC ...... *G06F 16/1744* (2019.01); *G06F 16/2246* (2019.01); *G06F 16/951* (2019.01);
(Continued)

(58) Field of Classification Search
CPC ............... G06F 16/1744; G06F 16/951; G06F 16/2246; G06F 16/00; H03M 7/3088; H03M 7/42; H03M 7/6017
See application file for complete search history.

(56) References Cited

U.S. PATENT DOCUMENTS 5,020,121 A 5/1991 Rosenberg
5,257,314 A * 10/1993 Kimura ................ G10L 25/87
704/E11.005
(Continued)

FOREIGN PATENT DOCUMENTS

CN 100595596 C 3/2010
JP H01286627 A 11/1989
(Continued)

OTHER PUBLICATIONS

PCT; International Search Report & Written Opinion dated Aug. 21, 2018 in PCT application No. PCT/US2018/33510.
(Continued)

*Primary Examiner* — Etienne P Leroux
(74) *Attorney, Agent, or Firm* — SNELL & WILMER L.L.P.

(57) ABSTRACT

A computerized system and method of compressing symbolic information organized into a plurality of documents, each document having a plurality of symbols, the system and method including: (i) automatically identifying a plurality of sequential (also referred to as adjacent) and/or non-sequential symbol (also referred to as non-adjacent) pairs in an input document; (ii) counting the number of appearances of each unique symbol pair; and (iii) producing a compressed document that includes a replacement symbol at each position associated with one of the plurality of symbol pairs, at least one of which corresponds to a non-sequential symbol pair. For each non-sequential pair the compressed document includes corresponding indicia indicating a distance between locations of the non-sequential symbols of the pair in the input document.

17 Claims, 10 Drawing Sheets

Related U.S. Application Data a continuation-in-part of application No. 16/428,675, filed on May 31, 2019, now Pat. No. 11,269,810, which is a continuation of application No. 15/600,495, filed on May 19, 2017, now Pat. No. 10,387,377.

(60) Provisional application No. 62/939,448, filed on Nov. 22, 2019.

(51) Int. Cl.
   *G06F 16/22* (2019.01)
   *G06F 16/951* (2019.01)
   *H03M 7/30* (2006.01)
   *H03M 7/42* (2006.01)

(52) U.S. Cl.
   CPC ........... *H03M 7/3088* (2013.01); *G06F 16/00* (2019.01); *H03M 7/6017* (2013.01)

(56) References Cited

U.S. PATENT DOCUMENTS

| | | | |
|---|---|---|---|
| 5,260,693 A | 11/1993 | Horsley | |
| 5,369,605 A * | 11/1994 | Parks | G06F 16/90339 707/E17.035 |
| 5,389,922 A | 2/1995 | Seroussi et al. | |
| 5,594,435 A | 1/1997 | Remillard | |
| 5,617,552 A | 4/1997 | Garber et al. | |
| 5,704,060 A | 12/1997 | Del Monte | |
| 5,883,588 A | 3/1999 | Okamura | |
| 5,884,269 A | 3/1999 | Cellier et al. | |
| 5,951,623 A * | 9/1999 | Reynar | H03M 7/3086 358/1.9 |
| 5,995,954 A | 11/1999 | Loos | |
| 6,054,943 A | 4/2000 | Lawrence | |
| 6,356,660 B1 | 3/2002 | Shannon | |
| 6,400,289 B1 | 6/2002 | Banerji | |
| 6,414,610 B1 | 7/2002 | Smith | |
| 6,597,812 B1 | 7/2003 | Fallon et al. | |
| 6,674,908 B1 | 1/2004 | Aronov | |
| 6,720,894 B2 | 4/2004 | Wilson et al. | |
| 6,804,401 B2 | 10/2004 | Nelson et al. | |
| 7,365,658 B2 | 4/2008 | Todorov et al. | |
| 7,375,662 B2 | 5/2008 | Wilson et al. | |
| 7,428,341 B2 | 9/2008 | Suzuki et al. | |
| 7,515,762 B2 | 4/2009 | Suzuki et al. | |
| 8,078,454 B2 * | 12/2011 | Pouzin | G06F 40/143 704/10 |
| 8,108,204 B2 | 1/2012 | Gabrilovich et al. | |
| 8,373,584 B2 | 2/2013 | Trezise et al. | |
| 8,924,330 B2 | 12/2014 | Antebi et al. | |
| 9,390,098 B2 | 7/2016 | Teerlink | |
| 9,647,682 B1 | 5/2017 | Heng | |
| 9,792,291 B2 | 10/2017 | Shih | |
| 10,387,377 B2 | 8/2019 | Suzuki | |
| 11,269,810 B2 | 3/2022 | Suzuki | |
| 2002/0152219 A1 | 10/2002 | Singh | |
| 2002/0154040 A1 | 10/2002 | Vataja | |
| 2003/0023628 A1* | 1/2003 | Girardot | G06F 9/547 715/202 |
| 2003/0028509 A1 | 2/2003 | Sah | |
| 2003/0131184 A1 | 7/2003 | Kever | |
| 2006/0181443 A1 | 8/2006 | Lee et al. | |
| 2007/0055931 A1* | 3/2007 | Zaima | G06F 40/149 715/205 |
| 2009/0271181 A1 | 10/2009 | Balegar et al. | |
| 2011/0016097 A1 | 1/2011 | Teerlink | |
| 2011/0173166 A1 | 7/2011 | Teerlink | |
| 2012/0026020 A1 | 2/2012 | Korodi | |
| 2012/0179680 A1 | 7/2012 | Isaacson | |
| 2014/0282205 A1 | 9/2014 | Teplitsky | |
| 2016/0210508 A1 | 7/2016 | Ideuchi et al. | |
| 2017/0139947 A1 | 5/2017 | Abed et al. | |
| 2017/0187734 A1 | 6/2017 | Lee et al. | |
| 2019/0207624 A1 | 7/2019 | Cassetti et al. | |
| 2019/0286618 A1 | 9/2019 | Suzuki | |
| 2021/0102263 A1 | 5/2021 | Suzuki | |

FOREIGN PATENT DOCUMENTS

| | | |
|---|---|---|
| JP | H03247167 A | 11/1991 |
| JP | 2012124878 A | 6/2012 |
| JP | 2016052046 A | 4/2016 |
| JP | 2016184830 A | 10/2016 |
| JP | 2017022630 A | 1/2017 |
| KR | 1023536 B1 | 3/2011 |
| KR | 20110027679 A | 3/2011 |
| WO | 2000035098 A1 | 6/2000 |
| WO | 2007050018 A1 | 5/2007 |
| WO | 2018213783 A1 | 11/2018 |
| WO | 2021102263 A1 | 5/2021 |

OTHER PUBLICATIONS

Larsson et al; Offline Dictionary-based compression, Data Compression Conference, 1999, Proceedings. DCC 99 Snowbird, UT, USA Mar. 29-31, 1999, Los Alamitos, Ca., USA, IEEE Comput. Soc. US, Mar. 29, 19999 (Mar. 29, 1999, pp. 296-305, XP010329132, XP010329132.

Philip Gage: A New Algorithm for Data Compression, Dec. 31, 1994 (Dec. 31, 1994), XP055765182.

Dario et al.: Non Sequential Recursive Pair Substitution: Some Rigorous Results, arxiv.org, Cornell University Library, 201 Olin Library Cornell University Ithaca, NY 14853, Jul. 28, 2006 IP080245230.

PCT; International Search Report & Written Opinion dated Mar. 20, 2023 in PCT Application No. PCT/US2022/050617.

PCT; International search Report & Written Opinion dated Mar. 10, 2021 in PCT Application No. PCT/US2020/061508.

PCT; International Search Report & Written Opinion dated Mar. 10, 2021 in PCT/US2020/061508.

Horspool, R. Nigel and Cormack, Gordon V.; Constructing Word-Based Text Compression Algorithms; Data Compression Conference, 1992.

Dictionary Techniques {Lempel-Ziv Codes); at http://www.mini.pw.edu.pl/-herbir/www/?download=noles%208.pdf; 2014.

Keramidas, et al.; Dynamic Dictionary-Based Data Compression for Level-1 Caches; Architecture of Computing Systems—ARCS 2006; Lecture Noles in Computer Science, vol. 3894; 2006.

Rora, Nilin and Arora, Esha; Dynamic Word Based Data Compression Algorithm for Text Using Tagged SUB Opltimal Code {TSC); International Journal of Advanced Technology & Engineering Research (IJATER) 1st International Conference on Research in Science, Engineering & Management (IOCRSEM 2014) 2014.

Kosko, Bart; Adaptive bidirectional associative memories; Applied Optics; vol. 26, No. 23; pp. 4947-4960; Dec. 1, 1987.

Kosko, Bart; Bidirectional Associative Memories; IEEE Transactions on Systems, Man, and Cybernetics; vol. 18, No. 1; Jan./Feb. 1988.

Manger, Robert and Puljic, Krunoslav; Multilayer Perceptrons and Data Compression; Computing and Informatics; vol. 26, p. 45-62; 2007.

You Can Say Thal Again!—Text Compression; Computer Science Unplugged at http://csunplugged.org/wp-content/uploads/2014/12/unplugged-03-lext_compression.pdf; 2002.

Sayood, Khalid; Introduction to Data Compression {Chapters 1, 3, and 5); Elsevier Inc.; 2012.

Lin, Ming-Bo; A Hardware Architecture for the LZW Compression; Journal of VLSI Signal Processing 26, pp. 369-381; JOOO.

Mesut, Allan and Carus, Aydin; A New Approach to Dictionary-Based Lossless Compression; International Scientific Conference-Gabrovo; Nov. 18-19, 2004.

Ye, Yan and Cosman, Pamela; Dictionary design for text image compression with JBIG2; IEEE Transactions on mage Processing; vol. 10, No. 6; Jun. 2001.

(56) References Cited

OTHER PUBLICATIONS

Kuruppu, Shanika et al.; Iterative Dictionary Construction for Compression of Large DNA Data Sets; IEEE/ACM Transactions on Computational Biology and Bioinformalics; vol. 9, No. 1; pp. 137-149; Jan./Feb. 2012.

Storer, James A.; Lossless Image Compression Using Generalized LZ1-Type Methods; Proceedings IEEE Data Compression Conference; pp. 290-299; 1996.

Larsson, N. Jesper and Moffat, Alistair; Off-Line Dictionary-Based Compression; Proceedings of the IEEE; vol. 88, No. 11, pp. 1722-1732; Nov. 2000.

Claude, Francisco and Navarro, Gonzalo; Self-Indexed Text Compression using Straight-Line Programs; Fundamenta Informalicae XXI; IOS Press; pp. 1001-1023; 2001.

Kieffer, J.C. et al; Universal lossless compression via multilevel pattern matching; IEEE Transactions on Information Theory, vol. 46, No. 4; pp. 1227-1245; Jul. 1, 2000.

Deorowicz; Sebastian; Universal lossless data compression algorithms; Doctor of Philosophy Dissertation; Silesian University of Technology Faculty of Automatic Control, Electronics and Computer Science Institute of Computer Science; 2003.

Shibata, Yusuke et al.; Speeding Up Matching by Text Compression; CIAC2000, LNCS 1767, pp. 306-315; 2000.

Clustor Case Studies: Byte Pair Encoding: The Problem; http://web.archive.org/web/20031027234441/http://www.cssemonash.edu.au/cluster/RJK/Compress/problem.hlml; Oct. 27, 2003.

Cinque, L. et al.; Scalability and Communication in Parallel Low-Complexity Lossless Compression, Mathematics in Computer Science (Abstract only); vol. 3, Issue 4, pp. 391-406, Jun. 2010-406.

\* cited by examiner

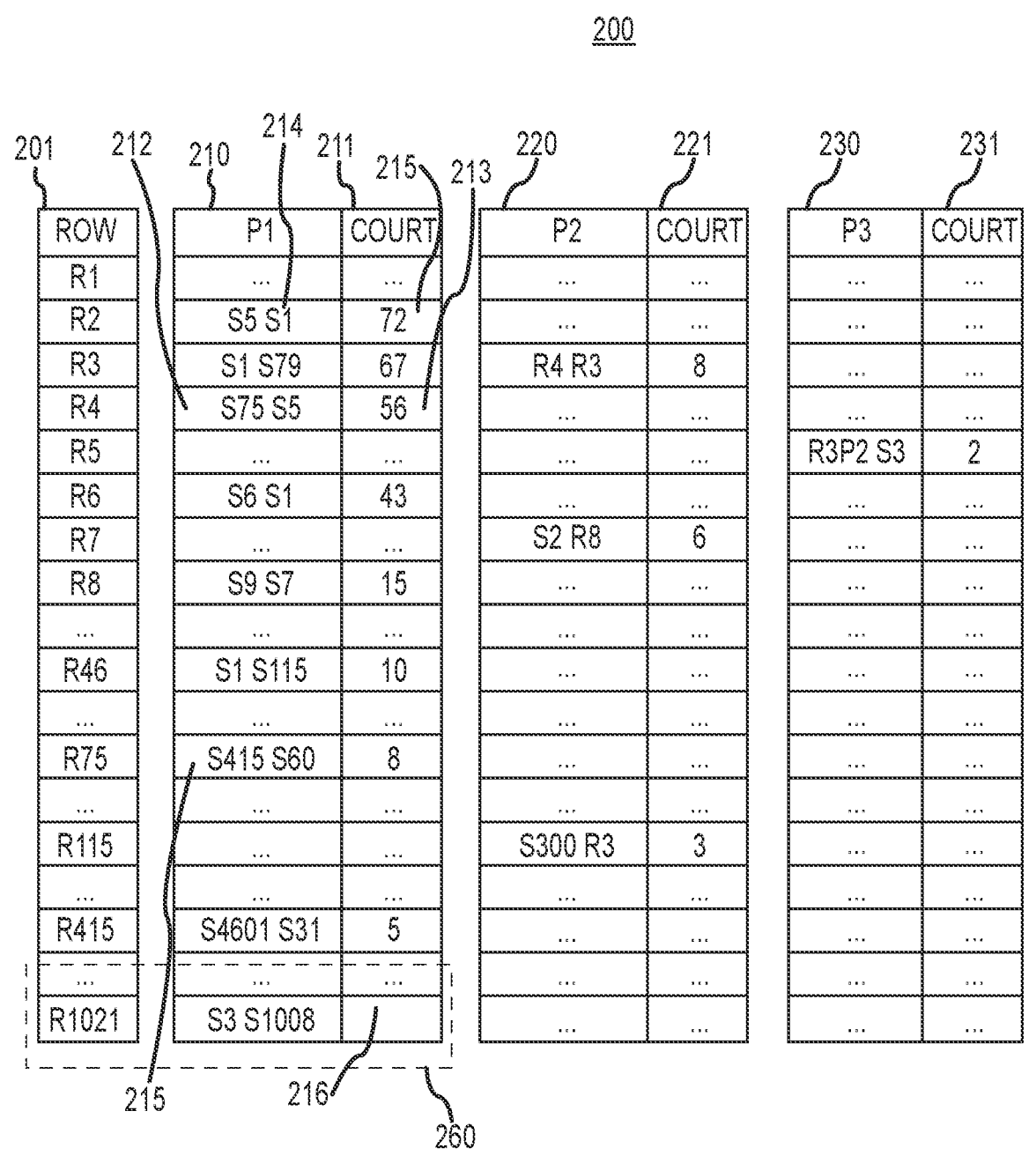

200

| ROW | P1 | COURT | P2 | COURT | P3 | COURT |
|---|---|---|---|---|---|---|
| R1 | ... | ... | ... | ... | ... | ... |
| R2 | S5 S1 | 72 | ... | ... | ... | ... |
| R3 | S1 S79 | 67 | R4 R3 | 8 | ... | ... |
| R4 | S75 S5 | 56 | ... | ... | ... | ... |
| R5 | ... | ... | ... | ... | R3P2 S3 | 2 |
| R6 | S6 S1 | 43 | ... | ... | ... | ... |
| R7 | ... | ... | S2 R8 | 6 | ... | ... |
| R8 | S9 S7 | 15 | ... | ... | ... | ... |
| ... | ... | ... | ... | ... | ... | ... |
| R46 | S1 S115 | 10 | ... | ... | ... | ... |
| ... | ... | ... | ... | ... | ... | ... |
| R75 | S415 S60 | 8 | ... | ... | ... | ... |
| ... | ... | ... | ... | ... | ... | ... |
| R115 | ... | ... | S300 R3 | 3 | ... | ... |
| ... | ... | ... | ... | ... | ... | ... |
| R415 | S4601 S31 | 5 | ... | ... | ... | ... |
| ... | ... | ... | ... | ... | ... | ... |
| R1021 | S3 S1008 | ... | ... | ... | ... | ... |

FIG.6

COMPUTERIZED SYSTEMS AND METHODS OF DATA COMPRESSION

CROSS REFERENCE TO RELATED APPLICATIONS

This application is a continuation-in-part of, claims priority to, and incorporates by reference the following: (1) U.S. application Ser. No. 16/951,954 filed on Nov. 18, 2020 and entitled Computerized Data Compression and Analysis Using Potentially Non-Adjacent Pairs, which claimed priority to U.S. Provisional Application No. 62/939,448, filed on Nov. 22, 2019, and (2) U.S. application Ser. No. 16/428,675 filed on May 31, 2019 and entitled Computerized Methods of Data Compression and Analysis, which is a continuation of U.S. application Ser. No. 15/600,495 filed on May 19, 2017 and entitled Computerized Methods of Data Compression and Analysis, which is now U.S. Pat. No. 10,387,377.

BACKGROUND

The field of the present invention relates to data compression, such as by lossless compression of text and other information that can be represented by symbols.

Previous text compression techniques are usable on only one file or document at a time. Such techniques do not scale easily to enormous data sets, i.e., "Big Data," or where data is spread across many different containers. Also, previous techniques do not track the number of times a particular symbol or string of symbols appear in the uncompressed text. The number of times a particular symbol or string appears in is valuable information that is useful for improving space savings, reducing processing time, and conducting contextual analysis.

SUMMARY

An example embodiment compresses symbolic information that is organized into a plurality of documents. Each of the uncompressed documents has a plurality of symbols. A document can be a string of symbols of any length (e.g., a sentence, paragraph, or text file). A symbol can be any code that constitutes or carries information (e.g., a letter, number, non-alphanumeric character, syllable, or word).

The example embodiment operates on an input document by identifying at least one of two adjacent (also referred to as sequential) symbols, two non-adjacent (also referred to as non-sequential) symbols, or both adjacent symbols and non-adjacent symbols in the document as a symbol pair. The example embodiment stores each unique symbol pair in a compression dictionary. The compression dictionary associates each stored symbol pair with a respective replacement symbol. The example embodiment also maintains a count of the number of times each unique symbol pair appeared in the input document. The example embodiment produces a compressed output document by replacing symbol pairs with their associated replacement symbols if the count for the symbol pair exceeds a threshold.

Some embodiments are programmed to repeat the compression process by using the output document as an input document for an additional pass. Certain embodiments recursively perform additional passes until no further replacements can be made (i.e., in the final pass, the output document is identical to the input document). Symbol pairs identified in recursive passes can include replacement symbols from a previous pass.

Some embodiments are programmed to be applied to multiple documents. In fact, the compression ratio improves as the size of the uncompressed data increases. The larger the data set, the more likely it is that the count associated with any given symbol pair will exceed the threshold, which results in more replacements and higher compression. Compression is optimized, in some of these embodiments, when the process recurs on all the documents until no further replacements are possible.

Some embodiments increase space savings and decrease the lookup time needed to access the compression dictionary by using, as a replacement symbol, the address of the replaced symbol pair in the compression dictionary.

Some embodiments sort the entries in the compression dictionary based on the count of the number of times a symbol pair appeared. The sorting is done to place the most frequently appearing symbol pairs in more accessible memory locations than less frequently appearing symbol pair. Sorting decreases lookup times during the replacement phase.

Some embodiments use patterns of replacement symbols and the count of the number of times certain symbol pairs appeared to analyze content.

In another embodiment, a computerized method of compressing symbolic information organized into a plurality of documents is disclosed. Each document has a plurality of symbols. With a first document of the plurality of documents as an input document, a computer automatically identifies a plurality of symbol pairs. Each symbol pair consists of two sequential or non-sequential symbols in the input document; at least one symbol pair consists of two non-sequential symbols in the input document. The computer counts the number of appearances of each unique symbol pair. The computer produces a compressed document that includes a corresponding replacement symbol at each position associated with one of the plurality of symbol pairs from the input document. At least one replacement symbol corresponds to a symbol pair consisting of two non-sequential symbols, and for each such pair the compressed document includes corresponding indicia indicating a distance between locations of the non-sequential symbols of the pair in the input document. In some instances the plurality of symbol pairs includes only those pairs of non-sequential symbols for which the distance between locations of the non-sequential symbols of the pair in the input document is less than a numeric distance cap.

In a third embodiment, the system may generate a symbol dictionary based on a first uncompressed document of a plurality of documents, each document having a plurality of symbols. The system may perform a first data compression on the first uncompressed document by at least one of the adjacent pair dictionary method or the non-adjacent pair dictionary method to generate a compressed output document. The system may append a new uncompressed document of the plurality of documents to the compressed output document to generate an appended compressed document. The system may update the symbol dictionary based on the appended compressed document to generate an updated symbol dictionary In some embodiments, the system may perform with the updated symbol dictionary, a second data compression on the appended compressed document by at least one of the adjacent pair dictionary method or the non-adjacent pair dictionary method. In some embodiments, the system may perform a word analysis of the appended compressed document based on the symbol dictionary to determine whether any new words are present. In some embodiments, the system may add a new word to the symbol dictionary based on determining the presence of new words in the appended compressed document. The system may update a frequency count of the symbol dictionary in response to adding the new words. In some embodiments, the system may update a frequency count of the symbol dictionary in response to determining the absence of new words. In some embodiments, the system may sort the symbol dictionary by order of frequency in response to updating the frequency count.

In some embodiments, performing the first data compression comprises (a) identifying a plurality of symbol pairs, each symbol pair consisting of two sequential symbols in the first uncompressed document (b) for each unique symbol pair of the plurality of symbol pairs, updating a count identifying the number of appearances of the unique symbol pair and (c) producing the compressed output document by causing the compressed output document to include, at each position associated with one of the plurality of symbol pairs from the input document, a replacement symbol associated by a compression dictionary with the unique symbol pair matching the one of the plurality of symbol pairs, if the count for the unique symbol pair exceeds a threshold In some embodiments performing the first data compression comprises (a) identifying a plurality of symbol pairs, each symbol pair consisting of two sequential or non-sequential symbols in the input document, one or more symbol pairs consisting of two non-sequential symbols in the first uncompressed document (b) for each unique symbol pair of the plurality of symbol pairs, updating a count identifying the number of appearances of the unique symbol pair and (c) producing a compressed document by causing the compressed document to include, at each position associated with one of the plurality of symbol pairs from the input document, including one or more symbol pairs consisting of two non-sequential symbols, (i) a replacement symbol associated by a compression dictionary with the unique symbol pair matching the one of the plurality of symbol pairs, if the count for the unique symbol pair exceeds a threshold, and (ii) for at least those symbol pairs consisting of two non-sequential symbols, indicia indicating a distance between locations of the non-sequential symbols of the pair in the input document.

In some embodiments performing the second data compression comprises (a) identifying a plurality of symbol pairs, each symbol pair consisting of two sequential symbols in the appended compressed document (b) for each unique symbol pair of the plurality of symbol pairs, updating a count identifying the number of appearances of the unique symbol pair and (c) producing a combined compressed document by causing the combined compressed document to include, at each position associated with one of the plurality of symbol pairs from the input document, a replacement symbol associated by a compression dictionary with the unique symbol pair matching the one of the plurality of symbol pairs, if the count for the unique symbol pair exceeds a threshold.

In some embodiments performing the second data compression comprises (a) identifying a plurality of symbol pairs, each symbol pair consisting of two sequential or non-sequential symbols in the appended compressed document, one or more symbol pairs consisting of two non-sequential symbols in the appended compressed document (b) for each unique symbol pair of the plurality of symbol pairs, updating a count identifying the number of appearances of the unique symbol pair and (c) producing a combined compressed document by causing the combined compressed document to include, at each position associated with one of the plurality of symbol pairs from the input document, including one or more symbol pairs consisting of two non-sequential symbols, (i) a replacement symbol associated by a compression dictionary with the unique symbol pair matching the one of the plurality of symbol pairs, if the count for the unique symbol pair exceeds a threshold, and (ii) for at least those symbol pairs consisting of two non-sequential symbols, indicia indicating a distance between locations of the non-sequential symbols of the pair in the input document.

In some embodiments the second data compression is only performed on an appended portion of the appended compressed document.

BRIEF DESCRIPTION OF THE DRAWINGS

FIG. 6 is a visual representation of a compression dictionary used the embodiment of FIG. 5.

The embodiments depicted are shown only schematically; all features may not be shown in full detail or in proper proportion; for clarity certain features or structures may be exaggerated or diminished relative to others or omitted entirely. The embodiments shown are only examples and should not be construed as limiting the scope of the present disclosure or appended claims.

DETAILED DESCRIPTION

Embodiment One

Embodiments of the data compression and analysis technique can be programmed in computer code as a set of computer instructions. When running on a computer, the computer instructions control a computer processor and cause it to perform the functions described herein. The computer instructions (e.g., computer software) can be stored in any computer memory accessible to the computer or encoded in computer hardware. Some embodiments are instantiated in special purpose computers or dedicated computer appliances. The documents on which the embodiments operate can be stored in the same or a different computer memory accessible to the computer system.

An example embodiment analyzes uncompressed text to identify adjacent pairs of symbols. The example embodiment replaces occurrences of a pair of symbols that appears more than a predefined number of times with an associated replacement symbol. Symbols can be alphanumeric characters, discrete groups of alphanumeric characters such as syllables or words, or any code that constitutes and carries information.

Figure 1:
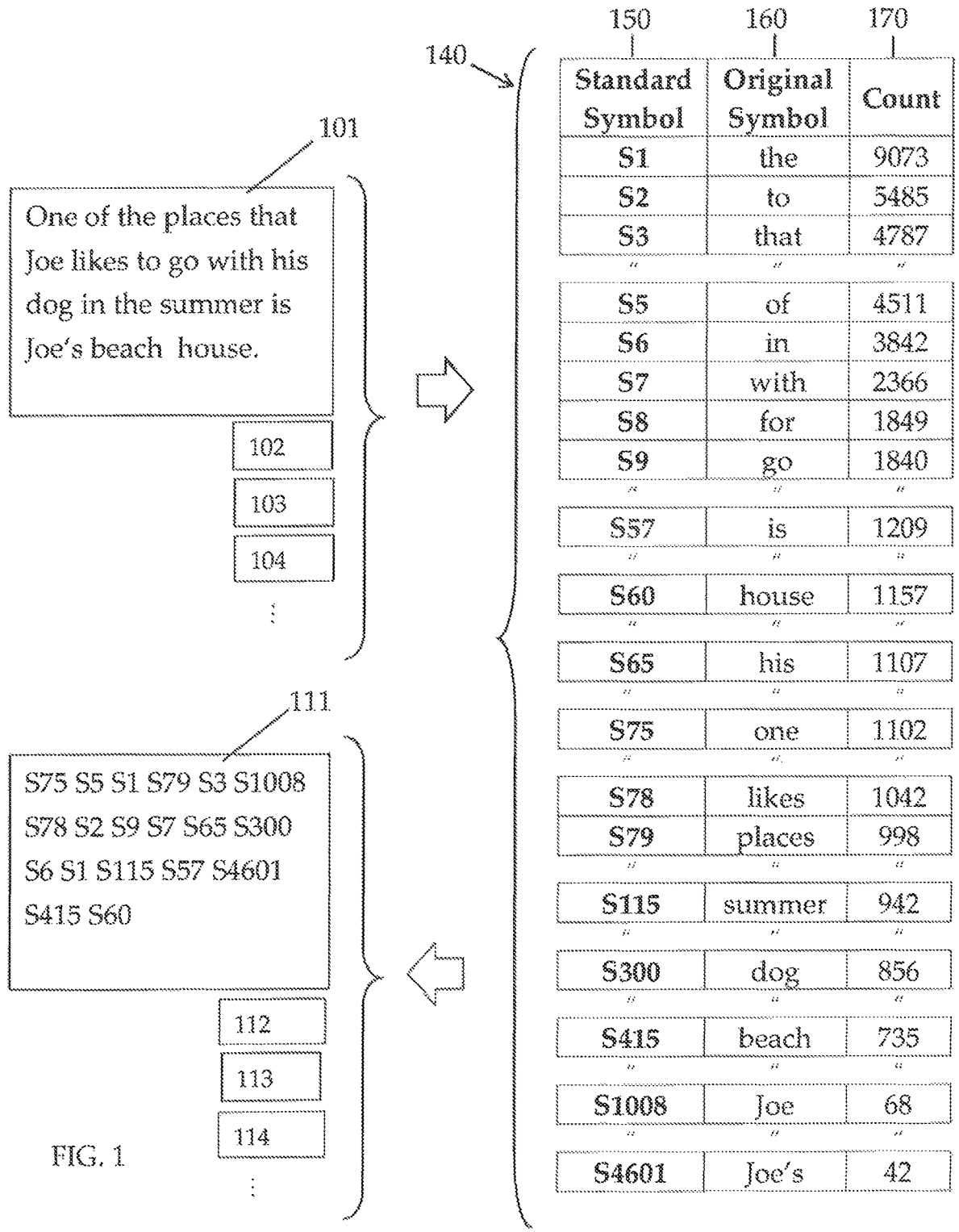
FIG. 1 is a visual representation of an example of a symbol dictionary generated by and employed in compression methods disclosed herein.
Figure 2:
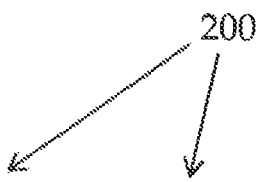
FIG. 2 is a visual representation of an example of a compression dictionary generated by and employed in compression methods disclosed herein.

In some embodiments, the original symbols in the uncompressed text are replaced with standard symbols during a preliminary phase. FIG. 1 is a representation of how an example embodiment standardizes uncompressed text. In certain circumstances, such as when there is a large variation in the lengths of the original symbols, standardization improves performance during subsequent operations.

Figure 5:
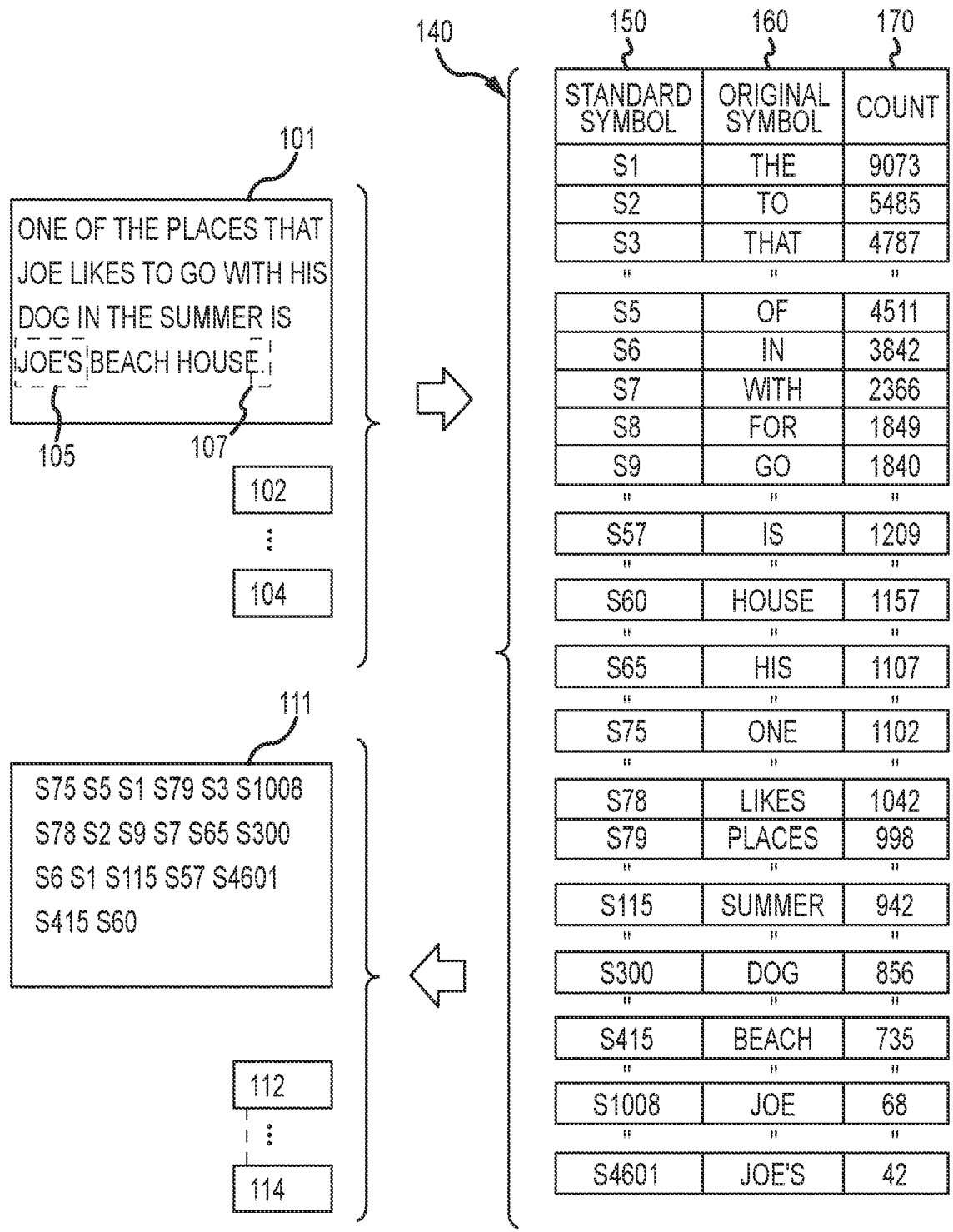
FIG. 5 is a visual representation of a text standardization process applied by an embodiment.

The example embodiment of FIG. 5 identifies and counts all occurrences of unique original symbols and stores each unique original symbol. Each original symbol is stored in a standardization memory in association with a standard symbol. In FIG. 5, standardization memory 140 associates an original symbol (in column 160) with its respective standard symbol (in column 150) and a count of how many times each original symbol appears in the uncompressed text (in column 170).

To identify unique original symbols, some embodiments are programmed to interpret certain non-alphanumeric characters (e.g., a space) as denoting a break between two symbols. The example embodiment interprets a space as a break between symbols yet retains the space in the standardized document. For example, document 111 is shown with spaces separating the standard symbols. However, other embodiments drop spaces and certain other non-alphanumeric characters entirely because the location of such characters can be restored or discerned from context. For example, a space between symbols can be inferred and reproduced based on the rules of the algorithm used to identify the original symbols. Likewise, the presence of certain non-alphanumeric characters can be inferred based on the grammatical rules of the language in which the text is written.

Some embodiments interpret certain non-alphanumeric characters as part of a symbol. The example embodiment of FIG. 5 identified text 105 as a symbol even though it contains an apostrophe. Other embodiments identify non-alphanumeric characters as symbols in their own right.

Some embodiments ignore capitalization while processing symbols. Such embodiments provide space savings by storing only a uniform-case version (e.g., lowercase version) of all original symbols. Such embodiments can restore the original text, including restoring capitalization, using grammatical and contextual rules regarding sentence structure and proper nouns.

Some embodiments interpret select symbols as signaling the end of a document. The example embodiment of FIG. 5 identifies the period at 107 as the separator between document 101 and document 102. Alternative embodiments separate text into documents based on carriage returns, paragraphs, cells, fields, records, rows, columns, pages, headings, tags from a markup language, information in a table of contents, or section or chapter markings. Any human-understandable or computer-readable markers or containers can be used to divide the text into documents. Other embodiments operate on documents that are separate computer files.

The example embodiment operates on multiple documents concurrently. Thus, during the standardization process, the example embodiment identifies and counts all occurrences of unique uncompressed symbols in all documents before replacing any of the original symbols in the documents.

The example embodiment replaces the original symbols of document 101 with standard symbols stored in standardization memory 140 to produce standardized document 111. Standardization memory 140 can be created during the standardization of input documents or can be pre-existing. FIG. 5 presents standardization memory 140 in a row-and-column format, but other data storage structures can be used.

The example embodiment sorts the entries in standardization memory 140 according to the counts stored in column 170. The example embodiment sorts the entries before standard symbols are assigned and stored in column 150. Sorting standardization memory 140 improves space savings because the example embodiment can assign shorter standard symbols to the symbols that appear most frequently. Sorting also allows frequently used standard symbols to be stored in highly accessible memory locations, which improves lookup times. After sorting, some embodiments may delete the counts to save space.

FIG. 5 shows the counts stored in column 170 of standardization memory 140. Alternative embodiments store the counts generated during standardization separately from the standardization memory.

A standard symbol can be an address indicating the location of the original symbol in standardization memory 140. Use of an address rather than an arbitrary symbol reduces the requisite memory space because there is no need to store extraneous symbols. Use of addresses as standard symbols also improves processing times during replacement and decompression because the example embodiment need only perform a single memory lookup rather than performing the multiple lookups that are required to translate between standard symbol and replacement symbol. When restoring the text to its original form, each standard symbol directs the example embodiment to the exact memory location of the original symbol.

Use of addresses as standard symbols, when applied after sorting, further improves lookup times because it ensures that more frequently occurring symbols are stored in more accessible memory locations than less frequently occurring symbols.

FIG. 6 is a representation of compression dictionary 200 that is used by the example embodiment to store associations between a unique symbol pair and its replacement symbol. Standardization memory 140 in FIG. 5 is shown stored separately from compression dictionary 200 in FIG. 6. Alternative embodiments can store the standardization memory as part of the compression dictionary.

Compression dictionary 200 is shown structured in rows and columns. Alternative embodiments use other data structures such as relational databases, document-oriented databases, graph databases, key-value stores, object databases, or hierarchical trees to maintain the compression dictionary (and standardization memory if used). Some embodiments use an existing compression dictionary. Other embodiments create the compression dictionary during operation.

Figure 7:
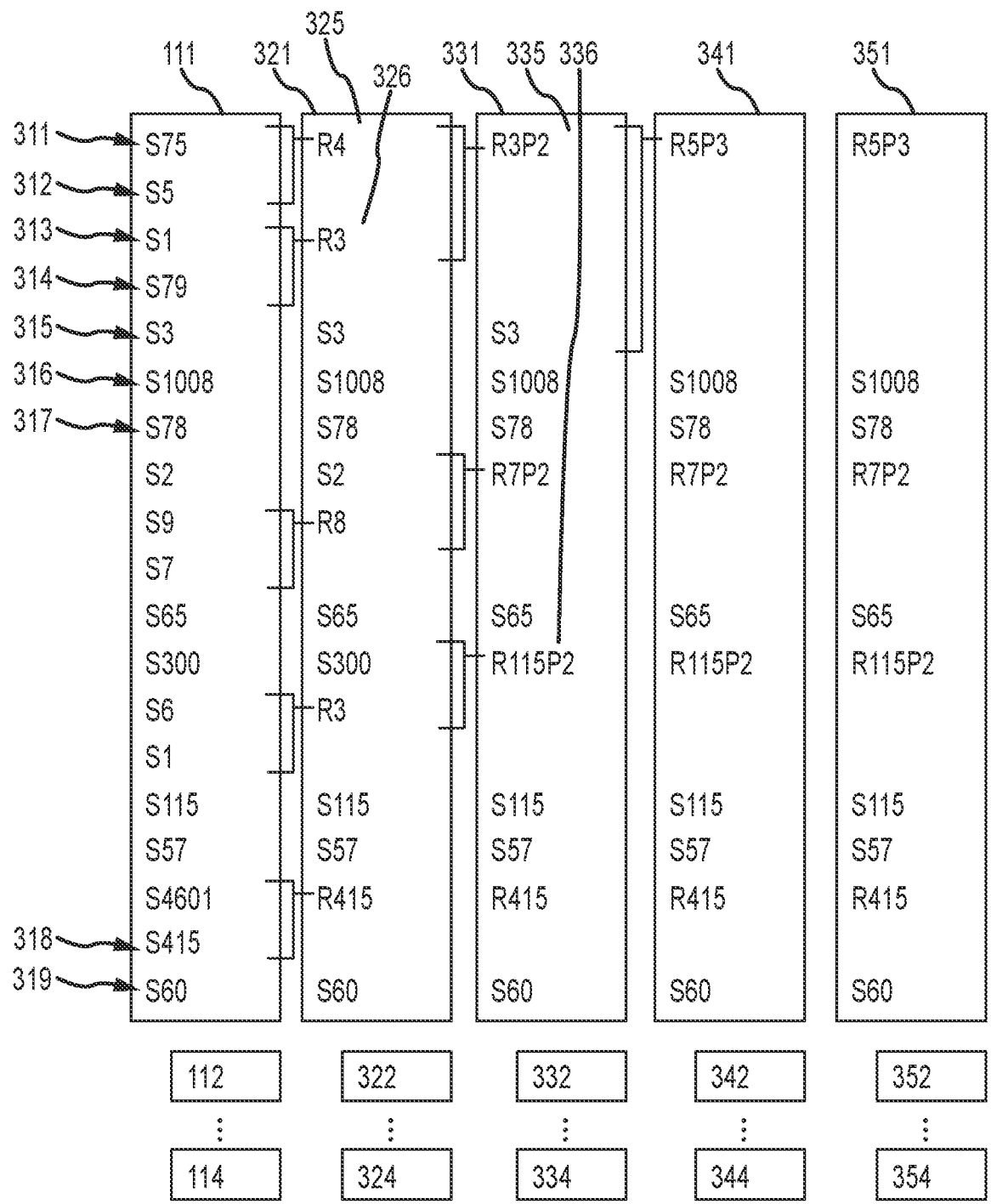
FIG. 7 is a visual representation operation of the embodiment of FIG. 6.

FIG. 7 is a representation of document 111 as it is operated on by the embodiment of FIG. 6. The example embodiment is programmed to repeat recursively until compression is complete, e.g., until no more pairs of symbols meet the threshold for replacement. The example embodiment operates on document 111 to create output document 351. Numerals 321, 331, and 341 refer to intermediate results before passes of the process carried out by the recursive embodiment; they are called "documents" here for ease of reference but can be deleted or overwritten during the next pass. Documents 112-114 are likewise processed in the same batch as document 111 to produce respective documents 352-354. Documents 322-324, 332-334, and 342-344 represent intermediate results between passes.

During each pass the example embodiment makes through the documents, the example embodiment identifies and counts the occurrence of each unique symbol pair ("the cataloging phase") and replaces symbol pairs with a count exceeding the replacement threshold ("replacement phase"). The example embodiment performs the cataloging phase on all documents before turning to the replacement phase.

Alternative embodiments identify and replace symbol pairs in one operation by processing the text of each document in sequential order. In such alternative embodiments, a pass through a document involves comparing each sequential symbol pair to entries of the compression dictionary. If the comparison results in a match, the compared symbol pair's count is incremented, and if the replacement threshold is met, the symbol pair is replaced with a replacement symbol. If the comparison does not produce a match, the symbol pair is identified as unique and added to the compression dictionary. Because such alternative embodiments do not use replacement symbols until a symbol pair's count exceeds the threshold for replacement, such embodiments schedule replacement of earlier instances of a symbol pair once the symbol pair's count exceeds the replacement threshold.

In the identification or cataloging phase of a pass, the example embodiment identifies symbol pairs in an input document by pairing each symbol with the next adjacent symbol in the document until the last symbol in the document is reached. All symbols, except first and last symbol, in the input document are therefore included in two symbol pairs: One symbol pair formed from pairing the symbol with the preceding symbol, and one symbol pair formed from pairing the symbol with the following symbol.

For example, when processing document 111, the example embodiment recognizes symbols 311 and 312 as a first pair and symbols 312 and 313 as a second pair. The example embodiment continues pairing symbols until it pairs symbol 318 and 319. The first symbol (symbol 311) and the last symbol (symbol 319) are each only paired with one other symbol (i.e., symbol 312 and symbol 318, respectively). All other symbols in the document are included in two symbol pairs.

Alternative embodiments do not compare every possible pairing of adjacent characters. Rather such embodiments skip symbol pairs having a symbol from the previously compared pair. For example, such embodiments, if operating on document 111, would recognize the pair of symbols 311 and 312, skip over the pair formed by symbols 312 and 313, and recognize the pair of symbols 313 and 314 as the next pair.

Once all pairings have been made for the symbols in documents 111-114, the example embodiment counts the number of times each unique symbol pair appeared in the documents. The example embodiment identifies and counts the unique symbol pairs by inserting every symbol pair into an array and performing a "pivot table" operation on the array to identify and count the number of occurrences of each unique symbol pair.

In each pass, the example embodiment generates a pass-related section in the compression dictionary. For example, referring to FIG. 6, columns 210 and 211 of compression dictionary 200 are the result of the cataloging phase of the first pass. Column 210 stores each unique symbol pair from the text processed in the cataloging phase of the first pass. Column 211 stores the count associated with each symbol.

FIG. 6 presents the count as being stored as a field in compression dictionary 200. A symbol pair's associated count could be stored as an attribute or metadata of the symbol pair, rather than as an entry in the compression dictionary. Alternative embodiments store counts associated with each pair separately from the compression dictionary. The example embodiment does not store a count for symbol pairs that appear only once (see entry 216 in compression dictionary 200). The presence of a symbol pair is sufficient to indicate it has appeared only once.

The example embodiment is programmed to sort the entries of compression dictionary 200 based on the counts of each symbol pair in a manner similar to that described above in connection with standardization of the symbols. In other words, after all symbol pairs are identified from documents 111-114, the example embodiment sorts entries of compression dictionary 200 (FIG. 6) before assigning replacement symbols or making any replacements to produce document 321 (FIG. 7). For the reasons similar to those described above in connection with sorting the standardization memory, the example embodiment achieves space savings and performance benefits by sorting compression dictionary 200.

A replacement symbol can be an address in the compression dictionary where the symbol pair associated with the replacement symbol is stored. In the embodiment of FIG. 6, replacement symbols are formed from a combination of the row identifier (see column 201) and a column identifier. The column identifier indicates the pass during which the symbol pair was identified (P1, P2, P3 in FIG. 6). Use of address-based replacement symbols provides similar benefits to those described in connection with standardization for similar reasons. Alternative embodiments assign unique replacement symbols that are unrelated to the address of the symbol pair.

In some cases, the replacement symbol can be just the portion of the address associated with the row identifier. For example, the replacement symbols from the first pass of the example embodiment are only the row identifier of its respective symbol pair's address. When the example embodiment decompresses a document, it is programmed to associate replacement symbols without a pass identifier as being from the first pass. In example embodiments, replacement symbols from the first pass are inserted into output documents and stored in the compression dictionary (if paired with another symbol in a sequential pass) without a pass identifier.

Alternative embodiments achieve further space savings in a similar way. For any given pass after the first pass, an embodiment can omit the pass identifier of replacement symbols that are most frequently paired with another symbol. For example, in Pass X, symbol pairs can be formed by pairing a replacement symbol from any of Passes 1, . . . , N, . . . , X−1 with another symbol. Suppose that, in Pass X, replacement symbols from pass N are most frequently paired with other symbols. In that case, rather than storing, in the compression dictionary, the full replacement symbol for Pass N replacement symbols, the embodiment omits the pass identifier from Pass N replacement symbols and simply stores an indication that Pass N is the most frequent pairing for Pass X. Thus, if any symbol pair stored in Pass X's section of the compression dictionary contains a replacement symbol with no pass identifier, the pass identifier is assumed to be that of Pass N. In this manner, space is saved because Pass N's pass identifier need only be stored once for all of the entries stored in the compression dictionary during Pass X.

The example embodiment of FIG. 6 only uses replacement symbols if their associated count exceeds a predetermined threshold. Every symbol pair in the document that corresponds to an entry in compression dictionary could be replaced (e.g., a threshold equal to one). However, a higher threshold allows for improved performance. If a large number of symbol pairs appear only once or only a few times, their replacement will not improve, or significantly improve, compression of the documents and will increase the storage requirements of the compression dictionary. A higher threshold can reduce processing time by eliminating the need to replace infrequently used symbol pairs.

The example embodiment improves space savings further by only retaining compression dictionary entries for symbol pairs that have a count exceeding the threshold. Because the example embodiment is programmed to perform the cataloging phase on all documents before beginning the replacement phase, symbol pairs that do not exceed the threshold will not be replaced. Thus, storing below-threshold symbol pairs increases the size of the compression dictionary without providing any without benefit. To avoid that inefficiency, the example embodiment truncates (i.e., deletes portions of the compression dictionary having entries with counts less than the threshold. For example, if the threshold for the first pass is four, the example embodiment would not retain portion 260 of FIG. 6.

Alternative embodiments retain portions of the compression dictionary with entries that have a count less than the threshold even though they will not be used with the current set of documents. If new documents are added to the set of documents, the counts for below-threshold symbol pairs could increase to the point where they meet the replacement threshold. Some alternative embodiments store below-threshold portions of the compression dictionary in a separate archive rather than the compression dictionary. The archive can be accessed when new documents are added.

In various embodiments, the replacement symbols can be associated with a symbol pair when the symbol pair is first identified or meets the replacement threshold. The example embodiment assigns replacement symbols after both sorting and truncation so that the most frequently used replacement symbols will have the shortest length and can be placed in the most accessible memory locations. In circumstances where a replacement symbol is the address of its associated symbol pair, each replacement symbol is associated with its symbol pair by virtue of the symbol pair's position in the sort order.

Alternative embodiments can assign replacement symbols any time before the replacement phase begins. Such alternative embodiments can sort the compression dictionary based on the counts or maintain the entries in their original order. After sorting, some embodiments delete the counts to save additional space.

During the replacement stage of a pass, the example embodiment creates a compressed output document by replacing symbol pairs in an input document with replacement symbols from compression dictionary 200. Alternative embodiments create anew output document distinct from the input document by inserting either the original symbols or replacement symbols in place of a pair of the original symbols. Such alternative embodiments later delete the input document. The example embodiment creates output document 321 (see FIG. 7) by overwriting symbol pairs in input document 111 with replacement symbols where appropriate.

The compression dictionary for the example embodiment only contains entries for symbol pairs that exceed the replacement threshold because entries with counts not exceeding the threshold were not retained. Thus, the example embodiment is programmed to replace the first symbol pair that matches an entry in the compression dictionary. When processing document 111, the example embodiment identifies the pair of symbols 311 and 312 (FIG. 7) and compares it to the entries of compression dictionary 200 (FIG. 6). The pair of symbols 311 and 312 are found in compression dictionary 200 (see entry 212). Because a match is found, the pair of symbols 311 and 312 is replaced with replacement symbol 325 in output document 321. The dictionary also contains the pair of symbols 312 and 313 (see 214), and the count exceeds the threshold for replacement (see 215). However, the pair of symbols 312 and 313 is not considered for replacement, because the example embodiment already replaced symbol 312.

Embodiments that do not truncate the compression dictionary must compare symbol pairs in a document to the compression dictionary and also check the count before replacement. Alternative embodiments analyze multiple possible replacements to determine which would maximize the number of total replacements or maximize the space savings. Other embodiments determine which pairs to replace based on minimizing the length of the replacement pairs or the lookup time required to decompress the document. Still further alternative embodiments attempt to replace the first pair of symbols and if no replacement is possible, skip over the pair that could be formed by combining the second symbol of the first pair with the next sequential symbol.

When the example embodiment cannot replace a symbol pair, it continues to consider the next symbol pair. For example, when the pair of symbols 315 and 316 are compared to the entries in the compression dictionary, no match is found. The example embodiment, therefore, moves to the next symbol pair (the pair of symbols 316 and 317). Embodiments that create a new output document rather than overwriting the symbols of the input document insert into the output document the first symbol of a symbol pair that cannot be replaced. If that last symbol of a symbol pair is the last symbol in a document, and the symbol pair does not match any of the entries in the compression dictionary, both symbols of the symbol pair must be inserted into the output document.

As described, the example embodiment is programmed to perform recursive passes until no further replacements are possible. Thus, the example embodiment begins a second pass by applying cataloging and replacement phases to document 321 to produce document 331. In the symbology of FIG. 7, symbol "R3P2" in document 331 refers to row 3 of the second pass. Symbol pairs identified in a second or subsequent pass can be two replacement symbols. See replacement symbol 335, which refers to the sequence of replacement symbol R4 (see 325) followed by replacement symbol R3 (see 326 in the first pass in document 321). Alternatively, symbol pairs identified in a later pass can be a combination of a replacement symbol and an uncompressed symbol. See replacement symbol 336, which refers to the sequence of uncompressed symbol S300 followed by replacement symbol R3. Compression dictionary 200 of FIG. 6, therefore, lists in row R3 of column 220 (P2) the sequential pair R4 followed by R3. Review of column 210 reveals that the sequence R4 followed by R3, in turn, denotes symbol S1 followed by S79 followed by S75 followed by S5. Thus, in this example, after the second pass (P2), the example embodiment has replaced the four-symbol "phrase" S1-S79-S75-S5 with the single symbol R3P2.

Sequential passes by the example embodiment result in additional columns 220 and 230 (FIG. 6) that store symbols pairs from each respective pass. In the example embodiment, each pass in which unique symbol pairs are discovered results in additional columns being added to compression dictionary 200 to store the newly identified symbol pairs and their respective counts (see columns 221 and 231). FIG. 6 presents symbols discovered in later passes in separate columns to illustrate the recursive nature of the embodiment.

The example embodiment only makes replacements from the column or section of compression dictionary 200 created during the instant pass. Storing replacement symbols in pass-specific sections reduces lookup times because the embodiment does not need to search through entries having replacement symbols that will not be used in the current pass.

Alternative embodiments store symbol pairs identified in different passes in a common column or memory area. Such embodiments can increase space savings because they use less complex replacement symbols. For example, an embodiment that stores all identified symbol pairs in the same column of the compression dictionary could use a replacement symbols that consists entirely of a row identifier. In any embodiment, close attention to the choice of symbology for the replacement symbol is capable of producing increased compression.

As shown in FIG. 7, a third pass performed on document 331 produces document 341, and a fourth pass performed on document 341 to produce document 351. If the output of fourth pass (document 351) is the same as the output of the third pass (document 341), and assuming this remains true for all other documents that are being compressed concurrently with document 111, then the example embodiment stores the last output version of each document and the compression process terminates. The example presented in FIG. 7 only shows four passes of the process applied to the example text. However, any number of passes can be performed. In some embodiments, the number of passes can be a fixed number. In other embodiments, a maximum number of passes can be set, but the process is programmed to terminate if no further replacements are made before the cap.

As more passes are performed on a set of documents, the number of symbol pairs identified and the count of each identified symbol pair tends to decrease, hence the incremental size reduction provided by each additional pass decreases. However, each additional pass will consume additional processing resources. To balance the size reduction against processing resources, certain embodiments are programmed to terminate the process if the size reduction resulting from a given pass falls below a certain limit (e.g., if a given pass produces less than a half of a percent size reduction). Other embodiments terminate the process based on a different factor, such as the number of new symbol pairs found being less than a fixed amount or the count of the most frequently occurring symbol pair falling below a certain level. For another example, an embodiment can be constructed to terminate the process if the count of the most frequently occurring symbol pair in a pass falls below a predetermined percentage of the count of the most frequently occurring symbol in the first pass.

Once the criterion for terminating the process has been met, some embodiments are programmed to replace any identified symbol pairs found in the pass that triggered the termination condition. Other embodiments terminate the process immediately upon recognizing the termination condition, without replacing symbol pairs found in that last pass. Still further embodiments terminate mid-pass if an insufficient number of symbol pairs are found after processing enough text to determine that the resultant space savings would fall below a predetermined amount. Any symbol pairs that are not replaced would not need to be stored in the compression dictionary or assigned a replacement symbol.

Compression dictionary 200 can grow to have any number of columns depending on the number of passes performed on a plurality of documents. Thus, FIG. 6 only shows a portion of compression dictionary 200 relevant to documents 310-350.

The example embodiment performs sort and truncation operations at the end of each cataloging phase. However, thresholds applied during successive passes can differ from the threshold of the first pass. The example embodiment uses lower replacement thresholds for additional passes.

Some embodiments determine ideal values for the replacement thresholds of each pass by compressing a subset of the documents in a series of trials with different pass thresholds values in each trial until the best compression is achieved.

Figure 8:
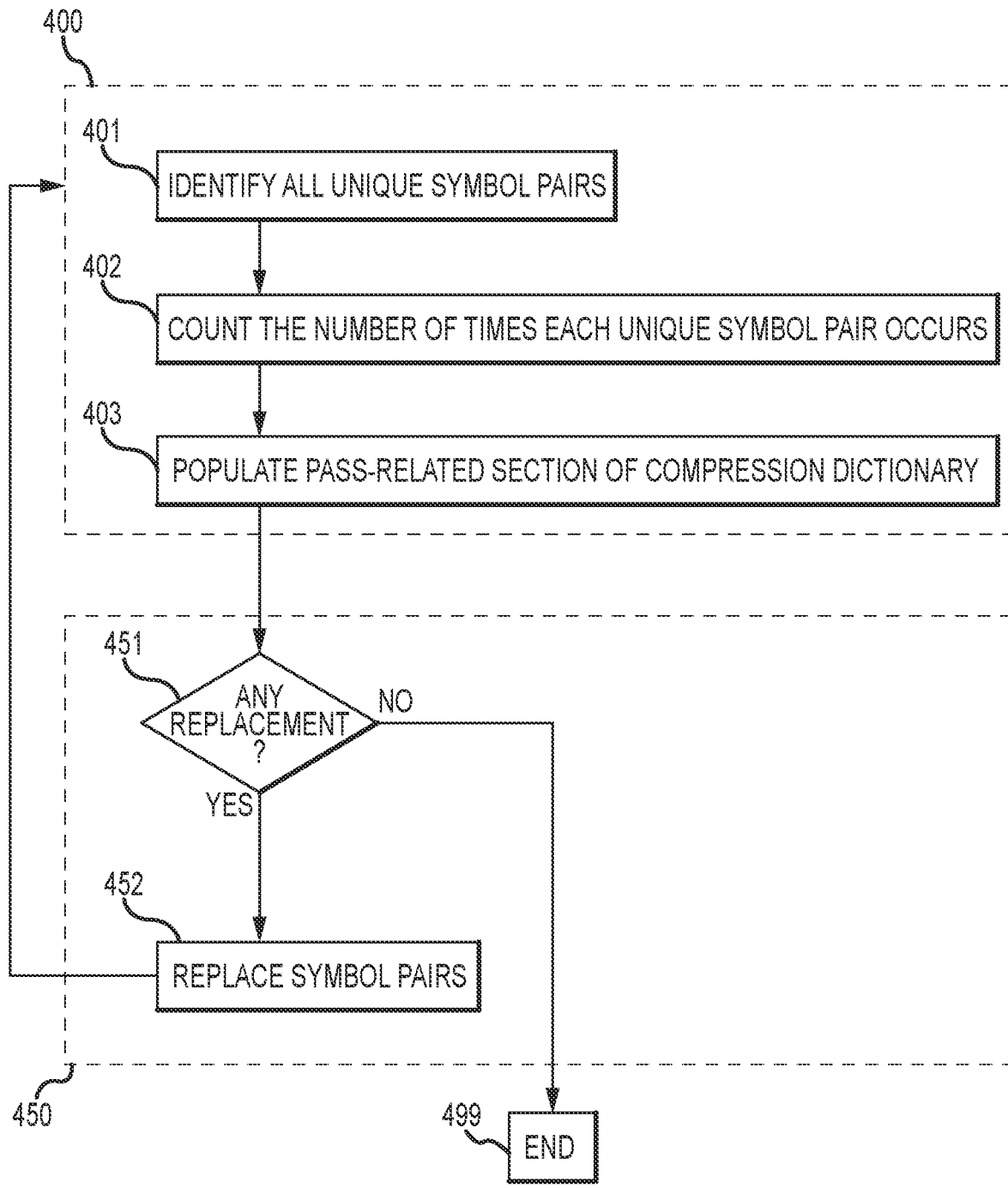
FIG. 8 is a flowchart that shows the operation of the embodiment of FIG. 6.

FIG. 8 is a flowchart showing the operation of the example embodiment. Cataloging phase 400 for any pass begins with identifying all unique symbols (401). Next, the example embodiment counts the number of occurrences of each unique symbol (402). Next, the example embodiment populates the compression dictionary with the unique symbols (403). Populating the compression dictionary can include reordering the unique symbol pairs based on their counts, omitting symbol pairs with counts that do not exceed the threshold, and associating replacement symbols with each unique symbol pair. The example embodiment completes cataloging phase 400 on all documents before moving to replacement phase 450.

During replacement phase 450, the example embodiment searches the input documents for symbol pairs that match entries in the compression dictionary (451). If any replacements are possible, the example embodiment replaces symbol pairs with an associated replacement symbol (452). The example embodiment enforces the threshold at 403 by populating the compression dictionary with only symbol pairs that exceed the threshold; however other embodiments that retain symbol pairs with counts that do not exceed the threshold enforce the threshold by only replacing symbols pairs with counts exceeding the threshold. After replacements are made (452), the example embodiment operates recursively by returning to cataloging phase 400 to begin a subsequent pass on the output of the previous pass. As part of the recursion process, the example embodiment adjusts the replacement threshold (not shown) according to the settings for the subsequent pass. If no replacements are possible during a pass, the example embodiment stores the compressed output documents and terminates (499). When required, the example embodiment restores the compressed documents by reversing the replacement phase of each pass.

The example embodiment handles new documents by decompressing all compressed documents, deleting the compression dictionary, and with the new documents as part of the plurality of documents, re-applying the process (i.e., 400-499) to the uncompressed documents.

Compression of new documents can be scheduled for times when resource demand is expected to be low or by an offline system so that users do not experience noticeable delays when accessing compressed documents.

Alternative embodiments handle new documents by recursively applying cataloging and replacing passes to new documents without uncompressing any documents. In such embodiments, compression is improved if the compression dictionary is not truncated because symbol pairs identified in new documents could cause the count a particular replacement symbol that did not previously meet the replacement threshold to exceed the threshold and used in the new document.

Other embodiments recursively apply only the replacement phase to the new documents. For such embodiments, the documents in an original set of documents can act as a training set.

The process works best with large volumes of data. The more data that is compressed, the more likely it is that long sequences of symbols will be repeated. Thus, higher compression ratios can be achieved as the number of symbols increases. In that way, processes described with reference to the above embodiments are well suited to "big data" applications. In fact, the disclosed embodiments can result in greater data size compared to existing techniques if applied to very small data sets, in part because of overhead associated with the compression dictionary.

Likewise, if the plurality of documents includes only documents from a particular field of knowledge, the process can produce improved compression ratios because any given field of knowledge has common terms and phrases that are often repeated in texts dedicated to the field. On the other hand, when documents from a new field of knowledge are incorporated into the plurality of documents, the process encounters a learning curve in which the achievable compression ratio is decreased. Eventually, after processing a sufficient number of documents in a new field, the system can "learn" the terms of art from the new field, and the compression ratio improves.

Figure 9:
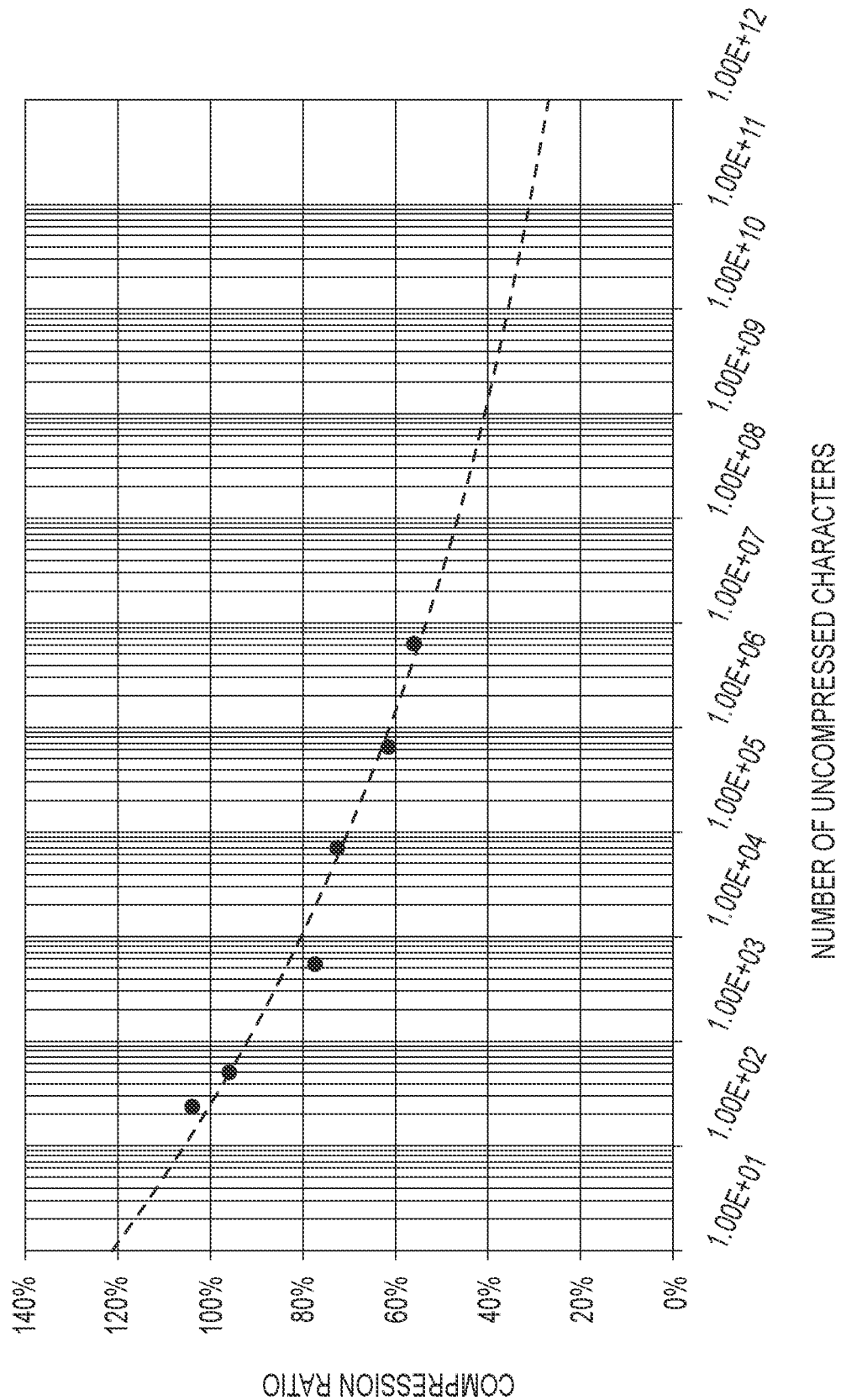
FIG. 9 is a chart showing results achieved by an experimental embodiment.

FIG. 9 summarizes experimental results of one embodiment. The experimental embodiment was programmed to identify each word in the input documents as a symbol. The experimental embodiment applied standardization to input documents, and both sorted and truncated the sections of the compression dictionary relating to a particular pass after the cataloging phase of that pass. The documents used in the experiment were abstracts from 15,000 randomly selected US patents (a little over one million words). Before the experimental embodiment was applied to the documents, all non-alphanumeric characters were removed, and all uppercase characters were converted to lowercase characters.

To test the premise that compression rates improve as data size increases, the experimental embodiment was applied to six different-sized groupings of documents. Table 1 details the size of each group and the achieved compression ratio. The data in Table 1 is plotted in FIG. 5 with the number of characters plotted on the x-axis (in log scale) and the compression ratio plotted on the y-axis. The dashed line in FIG. 5 represents a trend line based on a power regression of the data in Table 1.

TABLE 1

| Characters in Input Docs | Compression Ratio |
| --- | --- |
| 234 | 104.27% |
| 487 | 96.30% |
| 5,280 | 77.75% |
| 66,864 | 72.89% |
| 640,621 | 61.96% |
| 6,290,146 | 56.09% |

Compression ratio for the experimental results is expressed as a percentage and indicates the size of the compressed data as a percentage of the uncompressed data. In other words, compression ratio (in percent) equals the number of compressed characters divided by the number of uncompressed characters multiplied by 100. The number of compressed characters includes the number of compressed characters in the output documents plus the number of characters in the compression dictionary.

The experimental embodiment was able to improve upon the compression ratio achievable by Byte-Pair Encoding, which is at best 60% when applied to English language texts. Shibata Y. et al. (2000) Speeding Up Pattern Matching by Text Compression. In Bongiovanni G., Petreschi R., Gambosi G. (eds) Algorithms and Complexity. CIAC 2000. Lecture Notes in Computer Science, vol. 1767. Springer, Berlin, Heidelberg. Ultimately, the experimental embodiment achieved a compression ratio of 56.09% when applied to the full sample of approximately one million words.

The trend line in FIG. 5 suggests that, if the system is applied to a large enough data set, the compression ratio is likely to continue to improve. The trendline crosses below 40% at around a billion characters and below 30% at around a trillion characters. Wikipedia is an example that could provide a sense of the scale at which the compression ratio is likely to be most effective. In 2015, Wikipedia's English-language version was estimated to contain approximately 23 billion characters. In November 2009 (the last month in which Wikipedia released statistics on word count across all languages), Wikipedia (all languages) had approximately six billion words and was growing at a rate of one billion words every nine months. Assuming six characters per word, Wikipedia (all languages) therefore had thirty-six billion characters in November 2009. Assuming that such a growth rate has persisted, Wikipedia (all languages) is estimated to have approximately 16 billion words or one trillion characters in March 2017. Thus, a person desiring to archive a dataset on the scale of Wikipedia could benefit from compression using this process.

Certain replacement symbols that are generated after many successive passes replace long strings of text. If two compressed documents have such higher-order replacement symbols in common, a relationship between the documents can be deduced. As described above, authors of works in a particular field tend to repeat phrases and terminology unique to the field and works. A particular author can utilize a number of common phrases, concepts, and story characters frequently discussed by that author. In such situations, two works can be identified as related based on such commonalities. The commonalities could be used to group the documents together as a collection, to identify certain documents as derivative of other documents, or to suggest works to a reader based on the reader's interest in a particular field or a particular author. Such embodiments are particularly useful to a user who is unfamiliar with a field or in situations where the actual author is difficult to identify (e.g., a ghost author or a plagiarist).

The process can be applied to analyze any data that can be codified. For example, characteristic of the human face can be codified into a set of measurements (size of each eye, the separation between the eyes, eye color, the length of the brow, etc.). Those measurements could be coded or classified, formatted, and assembled into a document, using a consistent order. In such a manner, the compression process can be applied to a set of documents, where each document contains a plurality of measurements of a particular person's facial structure. After the documents are compressed, a system could perform facial recognition by comparing the replacement symbols in the compressed documents. Because higher-order replacement symbols represent long chains of symbols, the fact that two documents both have one or more of the same higher-order replacement symbols indicates a high likelihood that the faces, represented by the measurement in the documents, are from the same person.

A match between two documents can be determined based on the total number of matching higher-order replacement symbols exceeding a threshold. Alternative embodiments of the facial recognition system can select the closest match or matches and value indicating the degree of confidence in each match.

Such a facial recognition system could be used, for example, to control access to a secure location. The secure location can be a physical place (e.g., a building) or a device (e.g., a computer system, database, or secured portion thereon. An alternative use could be to determine the identity of an unknown person. Another alternative use is merely distinguishing whether or not certain measurements represent a human face or not.

In the case of controlling access to a secure location, an example embodiment would first use the compression process, as described herein, to compress a set of documents, each representing one of a group of known and authorized persons, and to produce a compression dictionary. Later, when requesting access to the secure entity, an unknown person initiates a process by which measurements are taken of his or her face. The unknown person's face could be measured by a non-invasive method (e.g., calculating the required values from an image captured by one or more cameras). The required values are then arranged into a new document that is compressed using the same compression dictionary. The system compares the replacement symbols in the compressed version of the new document to those contained in the previously compressed documents and outputs the results (e.g., just that a match exists and access should be granted or more specifically the believed identity of the unknown person). In some embodiments, the system can have the unknown person purport to identify himself or herself by other means, such as through voice announcement or a card swipe, and check the document containing information derived from the captured image of the unknown person's face against only the document containing pre-stored information about the person that the unknown person claimed to be. In other embodiments, the system can compare the document containing the captured image of the person's face against all documents containing pre-stored information about all authorized persons.

In the facial recognition system, the symbology of facial measurements in the documents can be exact numerical measurements (e.g., pupillary separation=64.57 mm or eye color (RGB)=161, 202, 241). Use of exact measurements can produce a high degree of certainty in any match that is found but is also likely to result in false negatives. Slight variances in the measurement conditions or equipment calibrations over time could result in misidentification. Thus, it is advisable that the symbology uses approximate measurements or values representing ranges in which the measurements fall. The symbology of the ranges can include numerical values of the range, an average value for the range, or an arbitrary symbol that represents the range.

Each facial recognition document needs to have a sufficient number of measurements to avoid misidentification. Too few measurements results in a risk of falsely identifying a match. Another use of the facial recognition process is to investigate and improve facial recognition systems based on the process discussed herein, because by analyzing a sufficiently large set of documents representing known faces, the system can be used to determine how many measurements are required and the optimal order or groupings of measurements necessary to produce sufficient points of comparison.

Other practical applications of the process use recognized commonalities in compressed documents to analyze the content of the documents. Symbol pairs that are counted and associated with replacement symbols have an underlying meaning. Thus, thoughts, preferences, or other information about the author or subject of a document can be inferred from the symbol pairs. Data collected during the cataloging phase can provide a wealth of information of such information.

Embodiments with extended functionality could utilize the process to learn more about the content of text by noticing certain replacement symbols associated with a particular noun or verb. For example, such a system could tag or remember certain replacement symbols that contain words of interest in the symbol pair denoted by the replacement symbol. Symbol pairs that include words such as "love" or "like," for example, can result in the associated replacement symbol being tagged in a way indicating that the symbol pair expresses a positive emotion. Symbol pairs that include words such as "hate" or "despise," by contrast, can result in the associated replacement symbol being tagged in a way indicating that the symbol pair expresses a negative emotion. For another example, symbol pairs containing nouns could be classified according to an area of interest, e.g., pets, family members, or products.

Using such tagging, based on the proximity of or sequence in which a pair or a set of tagged replacement symbols occurs in the compressed text, the process can infer a feeling expressed by the author about a particular entity or concept. For example, if a tagged replacement symbol indicating positive emotion is found in proximity to a tagged replacement system indicating pets, or just in proximity to a specific word like "dogs," then the system can infer that the author likes pets, or likes dogs. Tracking specific descriptive words can provide a more granular understanding of the concepts expressed by a particular author (e.g., a love of small dogs as opposed to love of dogs generally without regard to size). In such embodiments, replacement symbols assigned during later passes can inherit attributes assigned to earlier-assigned replacement symbols that make up the symbol pair associated with the later-assigned replacement symbol. For example, if a P2 replacement symbol is tagged as being a "positive emotion" indicator, and a different P2 replacement symbol is tagged as being a "pets" indicator, then in Pass 3, a P3 replacement symbol that includes both P2 replacement symbols can be tagged as indicating "loves pets." In this manner, repeated occurrences of higher-order replacement symbols among different authors can indicate a common interest. If works of two different authors contain that same P3 replacement symbol, they may share a common love of pets.

An implementation of one example embodiment is used in connection with an email archive.

Analysis of emails drafted by a particular author or a working group is used to identify the author's or the group's preferences, such as products, restaurants, cities, etc. that the author likes. An author that frequently combines words expressing positive feelings with words referencing a particular type of animal might be identified as potentially owning such an animal. The example embodiment then provides the associations determined from such analysis to a system for making recommendations of products or advertising to the user.

Embodiment Two

Turning to FIGS. 1-4, this embodiment generally describes systems and methods for compressing information that is organized into one or more documents. Each uncompressed document has a plurality of symbols. A document can contain or consist of a string of symbols of any length (e.g., a sentence, a paragraph, a text file, or a library of other documents). The disclosure can be applied to multiple documents considered individually as well. The compression ratio is expected to improve as the size of the uncompressed data increases, which can be achieved by using multiple or longer documents. The larger the data set, the more replacements produced by the disclosed systems and the higher the compression achieved.

A symbol can be any code that constitutes or carries information (e.g., a letter, number, non-alphanumeric character, syllable, or word). Symbols can constitute or represent alphanumeric characters, discrete groups of alphanumeric characters such as syllables or words, or numeric information of various types. If representative, a symbol can consist of any code that carries information, encoded in any way. For example, an ASCII code is a numeric representation of a letter of the alphabet or a special character. Various encoding schemes are possible. Other coded symbols can represent words for example.

In particular, general text compression techniques are typically usable on one file or document at a time. Such techniques do not scale easily to enormous data sets, i.e., "Big Data," or where data is spread across many different containers. Disclosed computerized data compression and data analysis systems may have advantages in improving compression for Big Data.

Also, compression techniques generally do not track the number of times a particular symbol or string of symbols appears in uncompressed text. That is valuable information, useful for saving space, reducing processing time, or conducting contextual analysis. Disclosed computerized data compression and data analysis systems may have advantages resulting from retaining such information.

General text compression techniques also typically rely on compressing symbols or strings of symbols that are adjacent to one another. Disclosed computerized data compression and data analysis systems may have advantages resulting from ability to compress or analyze based on either or both adjacent and non-adjacent symbols.

The disclosure here contemplates implementing data compression and data analysis systems with a computer. Disclosed techniques can be programmed in computer code as a set of computer instructions. Even if programmed on a general-purpose computer, such a computer should be considered non-generic and special-purpose once adapted because of the presence of specific programmed computer instructions, which control at least one computer processor and cause it to perform the functions described herein. Alternative instantiations can be accomplished equivalently with dedicated special-purpose computers or dedicated computer appliances, rather than program-adapted general-purpose computing machines. Either way, the specially programmed or structured computer comprises an improved computing machine that accomplishes functions not possible with computers not so constructed or adapted.

Computer instructions (e.g., computer software, if used in lieu of hardware-wired machines), can be stored in any computer memory accessible to the computer or encoded in computer hardware. The documents on which the embodiments operate can be stored in the same or a different computer memory accessible to the computer.

References to "a computer" or "computer" (or simply references to computer-programmed operations) should be understood to allow for implementation on either a single computer or on multiple computers, such as a system of interconnected devices, or a set of devices using distributed processing techniques. Each computer device, also, may utilize one or more processors.

An illustrative central method includes the following steps.

Step 1: Make a pass through the document 101 (see FIG. 1), replacing the words in the document 101 with associated symbols (denoted S1, S2, S3, . . . , Sn, . . . ), while creating a symbol dictionary (e.g., table 140 of FIG. 1) correlating symbols with words that respective symbols symbolize.

The document 111 containing the symbols may be considered an input document to the method discussed. It may be desired to store the symbolic version (input document 111) in a separate memory location while retaining the original document 101.

During the pass, check for duplication, and if found, increment a count of the number of instances of each word.

When the pass is complete, the symbol dictionary contains a series of entries, each having a symbol (e.g., column 150 of the table 140), the word associated with that symbol (e.g., column 160 of the table 140), and a count of the number of times that word appears in the document (e.g., column 170 of the table 140).

If multiple corresponding symbolic documents (e.g., 112, 113, 114, . . . ) are so created with the same encoding from multiple original documents (e.g., 102, 103, 104, . . . ), efficiencies can result. The symbol dictionary can be viewed as a standardization memory, allowing encoding or decoding of any or all of the multiple documents.

Step 2: Optionally, sort the dictionary by order of frequency.

Step 3: In a cataloging phase 10 (e.g., see FIG. 4), make passes through the input document 111 (and input documents 112, 113, 114, . . . , if present), creating a table of unique pairs of symbols, adjacent or not.

For example, start with the pair consisting of the symbols in the first and second locations, using the order of appearance in the document 111, then the symbols in the first and third locations, and then continue until reaching the symbols in the first and last locations.

Optionally, a numeric cap can be imposed to limit the number of locations, so that the process will consider only locations separated by less than the cap. For example, if the cap is ten words (and the document has more than ten words), then the process will continue through the symbols in the first and tenth locations, rather than through the symbols in the first and last locations.

After completing all (or the limited number) of pairs that include the first appearing symbol, continue with the symbols paired with the symbol in the second location. Start with the symbols in the second and third locations, then those in the second and fourth, and continue through the second and last (or through the second and eleventh, if the cap is ten, for example).

Then continue to repeat the process through the symbols in the penultimate and last locations. At that point, all combinations have been considered (assuming no cap).

Parallel processing computers can usefully assist with the cataloging phase 10 if desired, because the number of combinations expands with the factorial of the number of symbols and can grow large readily, especially with Big Data scenarios. The numeric cap, also, can be imposed to reduce the number of possible combinations to improve speed of this phase. As computers become faster and more powerful, the speed of this phase becomes less of an important consideration.

As the symbol pair at each location described above is encountered, add it to a table (e.g., table 200 of FIG. 2), if that pair is being encountered for the first time, or increment a counter in the table associated with the symbol pair, if the same pair has been encountered previously at one or more different location pairs, such that the table 200 already contains it.

The table 200 may be considered a compression dictionary, which associates unique stored symbol pairs with respective replacement symbols, keeping a count of the number of times the different symbol pairs appear in the input document 111 (or multiple input documents 111, 112, 113, . . . ).

Step 4: Sort the table 200 (compression dictionary) based on the frequency of appearance of a symbol pair. Sorting has the advantage of placing more frequently appearing symbol pairs in more accessible memory locations than less frequently appearing symbol pairs. This potentially facilitates decreased lookup times during a replacement phase 20 discussed below.

Step 5: Optionally, truncate the table 200 using a threshold. For example, entries can be removed from the table where the counters indicate that particular pairs of symbols have occurred only in one location each. For another example, the table can be truncated to remove entries reflecting symbol pairs that have occurred only once or twice. A higher threshold can be used as well. This step, if done, can reduce further the calculation overhead, perhaps at the cost of only some loss with respect to the degree of compression.

Step 6: In a replacement phase 20 (e.g., see FIG. 4), make further passes through the input document 111, using the table 200 of symbol pairs to replace symbol pairs with replacement symbols. Each replacement symbol indicates one of the corresponding symbol pairs. Store with the replacement symbol data specifying the distance between the locations at which the two members of a symbol pair are found (e.g., a number of intervening symbols, in which case adjacent symbols can be assigned a distance of zero; other distance schemes can be employed).

For example, starting with the most frequently occurring pair, and beginning at the first location in the document, scan the input document for the first occurrence of the first member of the symbol pair (Location1). From the location immediately after Location1, search forward until locating the first occurrence of the second member of the same symbol pair (Location2). If the optional numeric cap discussed above limits the number of locations, the "search forward" process here would stop after that number of locations. When the second member of the same symbol pair is found (Location2), perform three acts: (a) Replace the symbol at Location1 with the replacement symbol indicating the symbol pair (from the compression dictionary), (b) Include data specifying the distance between Location1 and Location2, (c) Delete the symbol at Location2.

The distance between two locations can be specified by a number indicating the count of places (e.g., number of words or symbols) between the two locations, the difference between two location numbers, or any other method. If the two symbols in a pair happen to be in adjacent locations, the distance may be considered "0" in a system specifying the number of words between locations. A number may be dropped entirely for adjacent locations in some embodiments. Absolute locations of the second symbol of a pair can be used instead of the relative addressing described in this paragraph if desired.

Next, beginning from the next location after Location1, search forward until locating the next occurrence of the first member of the same symbol pair (Location3). From the next location after Location3, search forward, again limited by the numeric cap if present, until locating the next occurrence of the second member of the same symbol pair (Location4). Replace the symbol at Location3 with the same replacement symbol indicating the symbol pair, include at Location3 indicia of the distance between Location3 and Location4, and delete the symbol at Location4. Continue until all instances of the most frequently occurring symbol pair have been exhausted.

Repeat the process with the next most frequently occurring pair. This will cause insertion of a different replacement symbol, also found in the compression dictionary, this time signifying the second pair. Repeat the process again for all symbol pairs in the (possibly truncated) compression dictionary.

Figure 3:
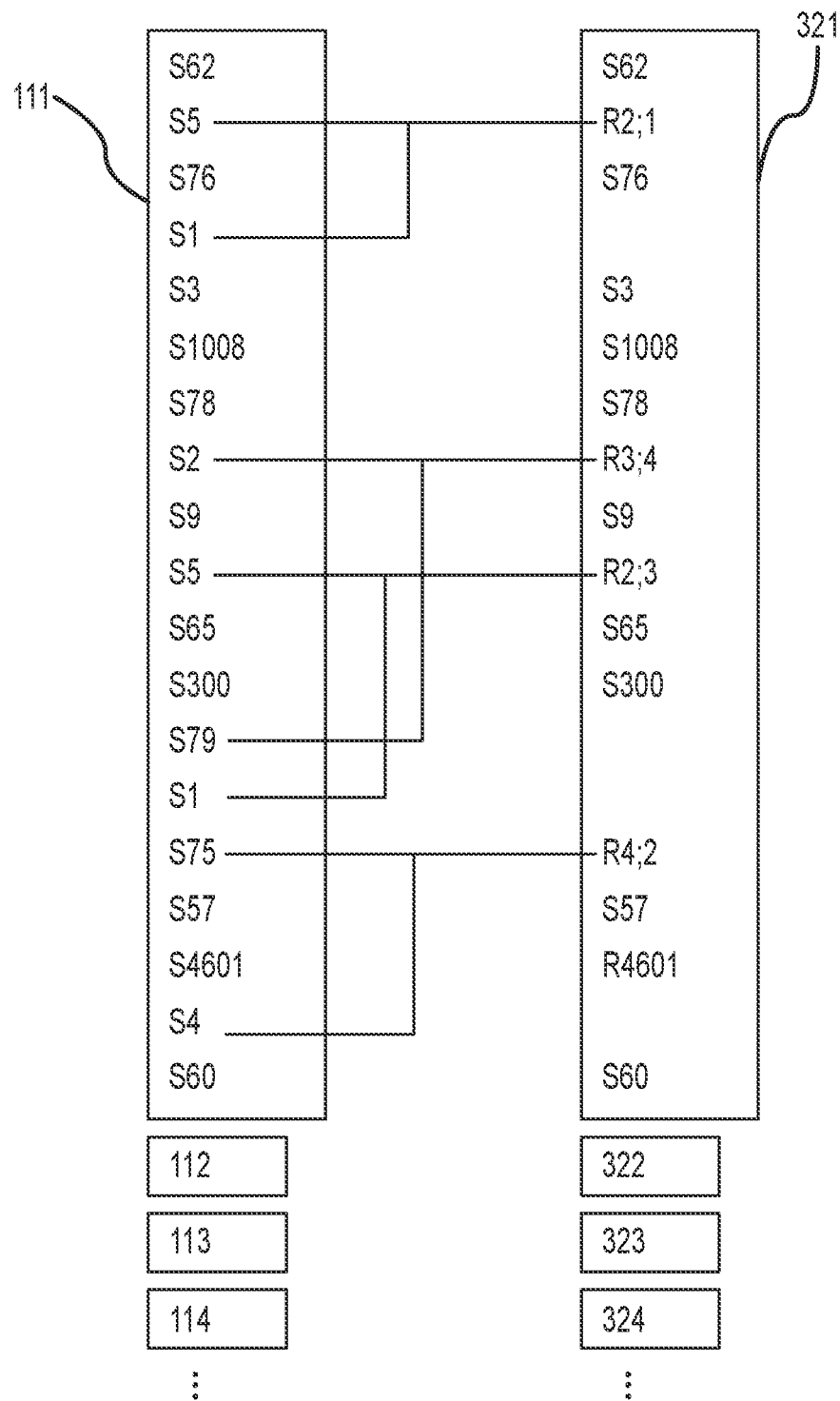
FIG. 3 is a visual representation of replacement of symbol pairs according to compression methods disclosed herein.
Figure 4:
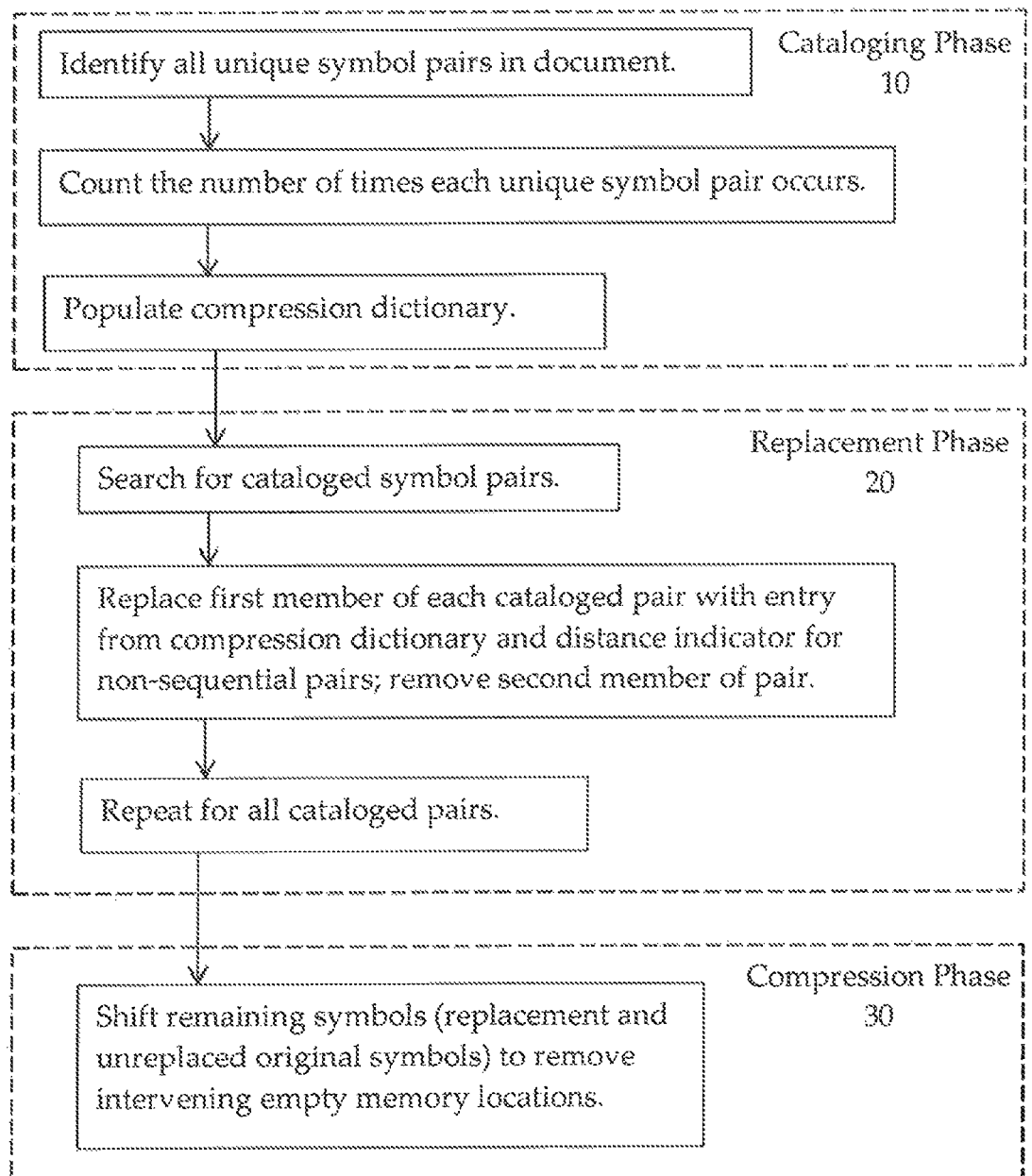
FIG. 4 is a flow diagram showing operation of compression methods disclosed herein.

In the example of FIG. 3, the symbol pair "S5 S1" appears twice, and is replaced by "R2;1" in the first instance (indicating one symbol or symbol location between them) and is replaced by "R2;3" in the second instance (indicating three symbols or symbol locations between them). Similarly, in that example the symbol pair "S2 S79" is replaced by "R3;4" and "S75 S4" by "R4;2". Further replacement can be made based on other symbol pairs from the table 200 that appear in the document 111.

The compression dictionary may contain instances in which two different symbol pairs have one symbol in common. For example, the most frequently occurring symbol pair may symbolize Word1 in combination with Word2 while a less frequently occurring symbol pair may symbolize Word3 in combination with Word2. For illustration, the top pair may symbolize the words "is . . . a" while the other pair symbolizes "are . . . a." In such instances, the number of replacements in a later pass through the document may result in fewer replacements than the frequency recorded in the compression dictionary, because some instances of the common word have been "used up" during the prior pass and thus are not available to be combined with the non-identical member of the lower-ranking symbol pair. This is not a problem, though, because it is considered advantageous to give higher priority to more frequently occurring symbol pairs. In some instances, if the number of replacements of a particular symbol pair fall below the threshold (or possibly a different threshold, or perhaps to zero) as a result of this effect, then that symbol pair may be truncated as well, to avoid further evaluation and storage of null entries or entries considered of limited value.

Step 7: In a compression phase 30 (e.g., see FIG. 4), produce a compressed output document by shifting the remaining symbols (replacement and unreplaced original symbols) so that they are in sequence, i.e., removing intervening empty memory locations. In the example of FIG. 7, output document 321 is shown before such compression; it will become shorter than document 111 when the spaces are removed.

It may be desired to shift after the replacement phase 20 concludes entirely, because unless shifting occurs after the entire replacement phase 20 ends, the measurements stated will not identify the actual number of words between those locations or may contain ambiguities. In FIG. 7 for example, the second instance of "S5 S1" is replaced with "R2;3" (at the location of the second occurrence of "S5"), indicative of the three symbols or symbol locations between them before any shifting has occurred (i.e., before the location of "S79" is removed by shifting due to replacement of "S2" with "R3;4").

Alternatively, step 7 can be done during step 6, either as each deletion is made, after each "pass" for each symbol pair, or in some other pattern (such as after a specified number of deletions or passes). If shifting can be done quickly, this may avoid the need to check empty memory locations.

Suppose shifting occurs after the top-ranked symbol pair is used to make replacements but before the process occurs for the next-ranked symbol pair. If one of the symbols in the top-ranked symbol pair has been deleted from an intermediate location, i.e., between the two symbols of the lower-ranking symbol pair, then the number indicating the distance between the two symbols of a lower-ranking symbol pair will not accurately list the number of words between those locations. In the example of FIG. 7, if the location of "S79" has already been removed, then the second occurrence of "S5 S1" would be replaced by "R2;2" at the location of "S5", instead of "R2;3 as described above and shown in FIG. 3. Nevertheless, it still may identify a location between adjacent remaining symbols (either symbols identifying unreplaced words or replacement symbols indicating the first member of a word pair).

If shifting is done before the replacement phase 20 concludes entirely, further, the process must adjust other distance measurements that span the removed memory location. For example, suppose location 10 contains a replacement symbol with the number 3, indicating that there were three memory locations between the locations of the first and the second symbols of that pair. Put another way, the number 3 indicates that the second symbol of the pair was found after location 13. Note that location 15 shifts one location lower with the removal of location 14. Now suppose a later replacement causes deletion of memory location 12 because that is the second member of the later pair. At that time, if shifting is done immediately, location 13 shifts to location 12. Now, the number 3 for the first pair, stated at location 10, must be changed to the number 2, to indicate that there are now only two memory locations between the locations of the first and the second symbols of that pair (i.e., the second member of that first pair is found after what is now location 12). To accomplish such adjustments, upon doing the shifting, such an immediate-shifting embodiment checks the data (subject to the cap on maximum distance if present) in previous locations to determine which have numbers referring to locations after the memory location being deleted.

As a result of the replacements and shifting, whenever it occurs, the document compresses. When the process finishes steps 6 and 7, whether or not those are combined, the compressed table 321 (with blanks removed; see FIG. 3) can be considered as an output document.

Again, alternatively, instead of overwriting the series of symbols representing the input document, the output document can be written in a different memory location while keeping the input document as well. However, if the input document (containing the symbols) has been saved separately from the original document (containing the actual words) in the first place, there is likely no need to save the input document, as the original document exists and the input document acts as a working copy anyway.

Step 8: Optionally, repeat the compression process by using the output document as an input document for another cycle, and further optionally repeat such cycles recursively.

At the inception of the first such additional cycle (second cycle overall), a symbol at a given location does not represent a single word but rather a word pair, separated by a stated distance. If such symbols occur in several locations in the input document, it indicates that a word pair is commonly used with a given separation. A document may contain repeated uses of a given phrase, or a given form. For instance, a variety of sentences may appear beginning with the words, "The <subject> is <object>" with the subject and object being different in different sentences, but the words "The" and "is" may be frequently paired at a fixed, non-adjacent distance. This may also occur with more substantive words of course, and patterns of more substantive words of course provide more interesting information for analysis. If such a word-pair commonly appears close to a different word-pair, in the first additional cycle, those two symbol pairs will appear in the input document to that cycle frequently in association with one another. The second cycle, if present, thus would cause replacement of the associated "pair of pairs" with a single, second-level replacement symbol, signifying four words (with specified spacings between each pair). A third cycle, if present, operating on second-level replacement symbols, would create third-level replacement symbols signifying eight-word combinations, and so forth.

Such a recursive process can operate for a fixed number of cycles. Or the process can perform cycles recursively until no further possible replacements are detected, which would result in the highest possible compression. Or the process can repeat for a maximum number of cycle unless, before the maximum is reached, no further possible replacements are detected.

If truncation is desired, or a cap is used (in both cases as those options are discussed in connection with the first cycle), such numbers applied during successive cycles can differ from the corresponding numbers applied during the first cycle or use the same numbers.

The replacement symbols can be the address of the replaced symbol pair in the compression dictionary. In some cases, the replacement symbol can be just the row identifier in a spreadsheet. In some cases with recursive cycles, the replacement symbol can be just the portion of the address associated with a row identifier in a spreadsheet, where columns represent sequential cycles and it can be assumed from context that the column refers to the previous cycle. Such embodiments thereby can achieve increased space savings and decreased lookup time needed to access the compression dictionary.

The patent discusses various uses of, or ways to apply, the compression techniques. Likewise, the modified processes disclosed above can be applied to compression or for any of the various other purposes listed in the patent.

For example, in some embodiments, a system can use patterns of replacement symbols and associated counts to analyze content or investigate texts. Especially if recursive cycles are used, the presence of higher-order replacement symbols can be used to deduce a relationship between different documents, suggesting two texts are related in some fashion. Metadata, such as the number of times certain pairs appear, generated during compression of documents can be used to analyze documents and find similarities therebetween.

Embodiment 3

Figure 10:
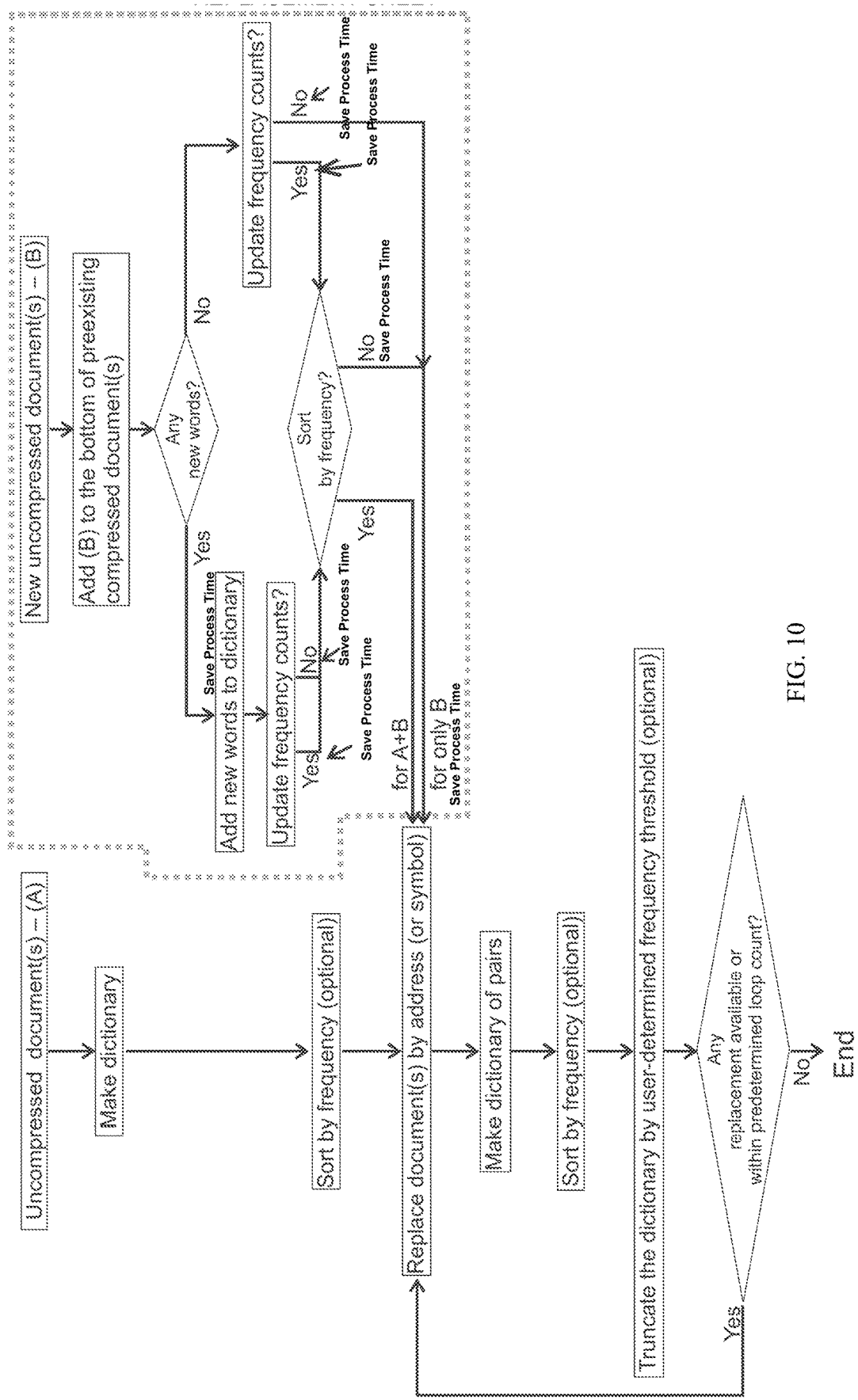
FIG. 10 is a flow chart of an alternate embodiment of an aspect of this disclosure.

Turning now to FIG. 10, a third embodiment is illustrated as process 1000. Process 1000 may comprise a combination of the processes described above with regards to embodiments 1 and 2. An advantage of this Embodiment 3 is that it decreases the processing time.

Process 1000 includes new data addition subprocess 1002 (dashed box). Embodiments one and two may be limited in that adding additional documents for compression to a previously compressed document tends to necessitate recalculation and recompression of the entire data set. Subprocess 1002 may enable addition of new data by updating the symbol dictionaries associated with the compressed documents generated by the system. In this regard, process 1000 tends to save system resources by decreasing processing time and memory usage. For example, by performing only the steps of subprocess 1002 to add new documents to existing compressed documents the system may avoid recompression of existing documents and process only those additional documents thereby improve total process time and save processing resources. Processing time improvements and system use overhead may be further improved by omitting the optional steps of subprocess 1002.

The system may select one or more first uncompressed documents to be compressed via the above described methods (step 1004). In response, the system may generate a symbol dictionary based on the selected first uncompressed documents (step 1006). For example, the system may generate a symbol dictionary (e.g., table 140 of FIG. 1 and FIG. 5) correlating symbols with words that respective symbols symbolize. As discussed above, the symbol dictionary can be viewed as a standardization memory, allowing encoding or decoding of any or all of the multiple documents.

The system may sort the symbol dictionary by order of frequency (step 1008). The system may perform pair replacement on the first uncompressed documents by address or symbol to generate a first compressed document (step 1010). For example, the system may apply either or both of the compression processes described above with regard to the embodiments one and two. In response the system may generate a compression dictionary (step 1012). For example, the system may generate table 200 of FIG. 2 which may be considered the compression dictionary, which associates unique stored symbol pairs with respective replacement symbols, keeping a count of the number of times the different symbol pairs appear in the input document 111 (or multiple input documents 111, 112, 113, . . . ). In another example, with reference to FIG. 6, the system may generate a compression dictionary 200 which can grow to have any number of columns depending on the number of passes performed on a plurality of documents.

The system may sort the symbol pairs of the compression dictionary by order of frequency (step 1014). The system may truncate compression dictionary based on a user-determined frequency threshold (step 1016). For example, as discussed above, if the number of replacements of a particular symbol pair fall below the threshold (or possibly a different threshold, or perhaps to zero) then that symbol pair may be truncated as well, to avoid further evaluation and storage of null entries or entries considered of limited value. The system may generate a first compressed output document and end or, may repeat the compression process by using the first compressed output document as an input document for another cycle, and further optionally repeat such cycles recursively to generate a recursively compressed output document (step 1018). In various embodiments, the system may repeat the cycles based on a loop count.

The in response to generating the first compressed output document or the recursively compressed output document system may execute subprocess 1002 to add a new uncompressed document to the compressed output document of step 1010. The system may select one or more new uncompressed documents to be added to an existing compressed file (step 1020). The system may append the new uncompressed document to the end of the a compressed document (i.e., the first compressed output document or the recursively compressed output document) to generate an appended compressed document (step 1022). The system may perform a word analysis of the appended compressed document based on the symbol dictionary and determine whether any new words are present (step 1024). Where no new words are present, the system may optionally update the frequency counts of the symbol dictionary (step 1026). Where new words are present the system may add the new words to the symbol dictionary (step 1028). Step 1028 may include optionally updating the frequency counts of the symbol dictionary in response to adding the new words (step 1032). In response to updating the frequency count of the symbol dictionary, the system may optionally perform a second sorting of the symbol dictionary by order of frequency (step 1030). In this regard, subprocess 1002 generates an updated symbol dictionary based on the appended compressed document.

The system may then return to step 1010 using the updated symbol dictionary and with the appended compressed document as the input document. In response to performing the second sorting of the symbol dictionary, the system may apply the compression process to the entire appended compressed document to generate a combined compressed document. Otherwise, the system may apply the compression process only to the appended portion of the appended compressed document. It will be appreciated that in the 'for only (B)' path processing speeds tend to be maximized by performing compression steps only on the new documents. In this regard, the previously compressed '(A)' sections are not processed by the system and processing time is reduced.

General Information for All Embodiments

The systems and methods herein can be applied (as noted above) to analyze various sorts of data that can be symbolized other than by words, which can lead to still further applications. One example is facial recognition based on numeric (or other) coding of different facial dimensions or characteristics, which can be used, for example, to control access to a secure location, such as a physical place (e.g., a building) or a device (e.g., a computer system, database, or secured portion thereof). The system can be used not only for recognizing faces but also (or instead) for distinguishing whether or not certain measurements represent a human face or for the purpose of improving facial recognition systems.

The systems and methods herein can also be used to infer preferences or interests (such as for advertising) or to determine commonalities of interest.

The systems and methods herein can apply to various applications, for example, compression of archives such as email, news, or other library archives. The process is well suited to such applications because the large number of the symbols involved is likely to produce a significant number of repeated strings, facilitating a high level of compression. Additions to the archive can be scheduled to occur during off-peak hours and can be structured in large batches as to best balance the required processing time against the space savings achieved by compression of the added documents.

Applications directed to cloud-based email and messaging systems could also benefit from systems and methods disclosed herein because such systems have many users.

Many of the emails are likely to be replies to and messages forwarded from other users. Such messages often include all or portions of the original message, which results in very long strings of duplicated symbols that the process can sometimes replace with as little as a single replacement symbol.

The systems and methods disclosed herein may be implemented using a "programmed computerized machine," can be implemented as or with general or special purpose computers or servers or other programmable hardware devices programmed through software, or as hardware or equipment "programmed" through hard wiring, or a combination of the two. A "computer" or "server" can comprise a single machine or can comprise multiple interacting machines (located at a single location or at multiple remote locations). Computer programs or other software code, if used, can be implemented in tangible, non-transient, temporary or permanent storage or replaceable media, such as by including programming in microcode, machine code, network-based or web-based or distributed software modules that operate together, RAM, ROM, CD-ROM, CD-ft CD-R/W, DVD-ROM, DVD.+−.R, DVD.+−.R/W, hard drives, thumb drives, flash memory, optical media, magnetic media, semiconductor media, or any future computer-readable storage alternatives. Electronic indicia of a dataset can be read from, received from, or stored on any of the tangible, non-transitory computer-readable media mentioned herein.

This specification identifies embodiments of the invention only and is not intended to limit the scope of the claims or legal equivalents thereof. For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim.

What is claimed is:

1. A computerized method of compressing symbolic information organized into a plurality of documents, each document having a plurality of symbols, the method comprising:
    (a) generating, by a computer based system, a symbol dictionary based on a first uncompressed document of the plurality of documents; performing, by the computer based system and with the symbol dictionary, a first data compression on the first uncompressed document by at least one of the adjacent pair dictionary method and the non-adjacent pair dictionary method to generate a compressed output document;
    (b) appending, by the computer based system, a new uncompressed document of the plurality of documents to the compressed output document to generate an appended compressed document;
    (c) updating, by the computer based system, the symbol dictionary based on the appended compressed document to generate an updated symbol dictionary;
    (d) identifying, by the computer based system, a plurality of symbol pairs, each symbol pair consisting of two sequential symbols in the first uncompressed document;
    (e) for each unique symbol pair of the plurality of symbol pairs, updating, by the computer based system, a count identifying the number of appearances of the unique symbol pair; and
    (f) producing, by the computer based system, the compressed output document by causing the compressed output document to include, at each position associated with one of the plurality of symbol pairs from the input document, a replacement symbol associated by a compression dictionary with the unique symbol pair matching the one of the plurality of symbol pairs, if the count for the unique symbol pair exceeds a threshold.

2. The method of claim 1, further comprising:
    performing, by the computer based system and with the updated symbol dictionary, a second data compression on the appended compressed document by at least one of the adjacent pair dictionary method and the non-adjacent pair dictionary method.

3. The method of claim 2, wherein performing the second compression comprises:
    (a) identifying, by the computer based system, a plurality of symbol pairs, each symbol pair consisting of two sequential symbols in the appended compressed document;
    (b) for each unique symbol pair of the plurality of symbol pairs, updating, by the computer based system, a count identifying the number of appearances of the unique symbol pair; and
    (c) producing, by the computer based system, a combined compressed document by causing the combined compressed document to include, at each position associated with one of the plurality of symbol pairs from the input document, a replacement symbol associated by a compression dictionary with the unique symbol pair matching the one of the plurality of symbol pairs, if the count for the unique symbol pair exceeds a threshold.

4. The method of claim 2, wherein performing the second compression comprises:
    (a) identifying, by the computer based system, a plurality of symbol pairs, each symbol pair consisting of two sequential or non-sequential symbols in the appended compressed document, one or more symbol pairs consisting of two non-sequential symbols in the appended compressed document;
    (b) for each unique symbol pair of the plurality of symbol pairs, updating, by the computer based system, a count identifying the number of appearances of the unique symbol pair; and
    (c) producing, by the computer based system, a combined compressed document by causing the combined compressed document to include, at each position associated with one of the plurality of symbol pairs from the input document, including one or more symbol pairs consisting of two non-sequential symbols, (i) a replacement symbol associated by a compression dictionary with the unique symbol pair matching the one of the plurality of symbol pairs, if the count for the unique symbol pair exceeds a threshold, and (ii) for at least those symbol pairs consisting of two non-sequential symbols, indicia indicating a distance between locations of the non-sequential symbols of the pair in the input document.

5. The method of claim 2, wherein the second data compression is only performed on an appended portion of the appended compressed document.

6. The method of claim 1, further comprising:
performing, by the computer based system, an analysis of the appended compressed document based on the symbol dictionary to determine whether any new words are present.

7. The method of claim 6, further comprising:
adding, by the computer based system, a new word to the symbol dictionary based on determining the presence of new words in the appended compressed document; and
updating, by the computer based system, a frequency count of the symbol dictionary in response to adding the new words.

8. The method of claim 7, further comprising:
sorting, by the computer based system, the symbol dictionary by order of frequency in response to updating the frequency count.

9. The method of claim 1, wherein performing the first data compression comprises:
(a) identifying, by the computer based system, a plurality of symbol pairs, each symbol pair consisting of two sequential or non-sequential symbols in the input document, one or more symbol pairs consisting of two non-sequential symbols in the first uncompressed document;
(b) for each unique symbol pair of the plurality of symbol pairs, updating, by the computer based system, a count identifying the number of appearances of the unique symbol pair; and
(c) producing, by the computer based system, a compressed document by causing the compressed document to include, at each position associated with one of the plurality of symbol pairs from the input document, including one or more symbol pairs consisting of two nonsequential symbols, (i) a replacement symbol associated by a compression dictionary with the unique symbol pair matching the one of the plurality of symbol pairs, if the count for the unique symbol pair exceeds a threshold, and (ii) for at least those symbol pairs consisting of two nonsequential symbols, indicia indicating a distance between locations of the non-sequential symbols of the pair in the input document.

10. A computer system comprising:
(a) a processor; and
(b) a tangible, non-transitory memory configured to communicate with the processor, the tangible, non-transitory memory having instructions stored thereon that, in response to execution by the processor, cause the processor to perform operations comprising the computerized method steps of claim 1.

11. The computer system of claim 10 that further comprises performing, by the computer system and with the updated symbol dictionary, a second data compression on the appended compressed document by at least one of the adjacent pair dictionary method and the non-adjacent pair dictionary method.

12. The computer system of claim 11 that further comprises:
(a) identifying, by the computer system, a plurality of symbol pairs, each symbol pair consisting of two sequential symbols in the appended compressed document;
(b) for each unique symbol pair of the plurality of symbol pairs, updating, by the computer based system, a count identifying the number of appearances of the unique symbol pair; and
(c) producing, by the computer based system, a combined compressed document by causing the combined compressed document to include, at each position associated with one of the plurality of symbol pairs from the input document, a replacement symbol associated by a compression dictionary with the unique symbol pair matching the one of the plurality of symbol pairs, if the count for the unique symbol pair exceeds a threshold.

13. The computer system of claim 11, wherein the second data compression is only performed on an appended portion of the appended compressed document.

14. The computer system of claim 10 that further comprises performing, by the computer system, an analysis of the appended compressed document based on the symbol dictionary to determine whether any new words are present.

15. The computer system of claim 14 that further comprises:
(a) adding, by the computer system, a new word to the symbol dictionary based on determining the presence of new words in the appended compressed document; and
(b) updating, by the computer based system, a frequency count of the symbol dictionary in response to adding the new words.

16. The computer system of claim 10, wherein performing the first data compression comprises:
(a) identifying, by the computer system, a plurality of symbol pairs, each symbol pair consisting of two sequential or non-sequential symbols in the input document, one or more symbol pairs consisting of two non-sequential symbols in the first uncompressed document;
(b) for each unique symbol pair of the plurality of symbol pairs, updating, by the computer based system, a count identifying the number of appearances of the unique symbol pair; and
(c) producing, by the computer system, a compressed document by causing the compressed document to include, at each position associated with one of the plurality of symbol pairs from the input document, including one or more symbol pairs consisting of two nonsequential symbols, (i) a replacement symbol associated by a compression dictionary with the unique symbol pair matching the one of the plurality of symbol pairs, if the count for the unique symbol pair exceeds a threshold, and (ii) for at least those symbol pairs consisting of two nonsequential symbols, indicia indicating a distance between locations of the non-sequential symbols of the pair in the input document.

17. An article of manufacture including a non-transitory, tangible computer readable storage medium having instructions stored thereon that, in response to execution by a computer based system, cause the computer based system to perform operations comprising the computerized method steps of claim 1.

* * * * *